United States Patent
Fujimoto

[11] Patent Number: 6,113,695
[45] Date of Patent: Sep. 5, 2000

[54] COATING UNIT

[75] Inventor: Akihiro Fujimoto, Kumamoto-ken, Japan

[73] Assignee: Tokyo Electron Limited, Tokyo, Japan

[21] Appl. No.: 09/119,655

[22] Filed: Jul. 21, 1998

[30] Foreign Application Priority Data

Jul. 23, 1997 [JP] Japan ................................ 9-197227

[51] Int. Cl.⁷ ........................................... B05C 7/02
[52] U.S. Cl. ........................... 118/684; 118/52; 118/313; 118/319; 118/320
[58] Field of Search ................. 118/684, 52, 319, 118/320, 313; 239/102.1, 102.2; 222/504; 427/240; 251/129.01

[56] References Cited

U.S. PATENT DOCUMENTS

| | | | |
|---|---|---|---|
| 5,127,362 | 7/1992 | Iwatsu et al. | 118/52 |
| 5,134,962 | 8/1992 | Amada et al. | 118/52 |
| 5,318,271 | 6/1994 | Frisch . | |
| 5,636,402 | 6/1997 | Kubo et al. . | |
| 5,665,200 | 9/1997 | Fujimoto et al. | 438/695 |

FOREIGN PATENT DOCUMENTS

| | | |
|---|---|---|
| 0 639 865 | 2/1995 | European Pat. Off. . |
| 43-4482 | 2/1968 | Japan . |
| 51-56845 | 5/1976 | Japan . |
| 59-115856 | 7/1984 | Japan . |
| 63-236559 | 10/1988 | Japan . |
| 2-61377 | 3/1990 | Japan . |
| 8-26849 | 3/1996 | Japan . |

*Primary Examiner*—Laura Edwards
*Attorney, Agent, or Firm*—Oblon, Spivak, McClelland, Maier & Neustadt, P.C.

[57] ABSTRACT

In a coating unit, a piezovalve driven by piezoelectric elements is used as an opening and closing valve 79. The use of the piezovalve which can nearly disregard delay time makes it possible to accurately control the time of working the opening and closing valve 79 and to finely control working speed thereof at the time of opening and closing the valve. Therefore, operation necessary for closing the valve can be slowly performed, thus appropriately preventing dripping of a resist solution and occurrence of bubbles in a resist solution by air which enters from a forward end of a resist nozzle 60.

14 Claims, 17 Drawing Sheets

PRIOR ART FIG. 18
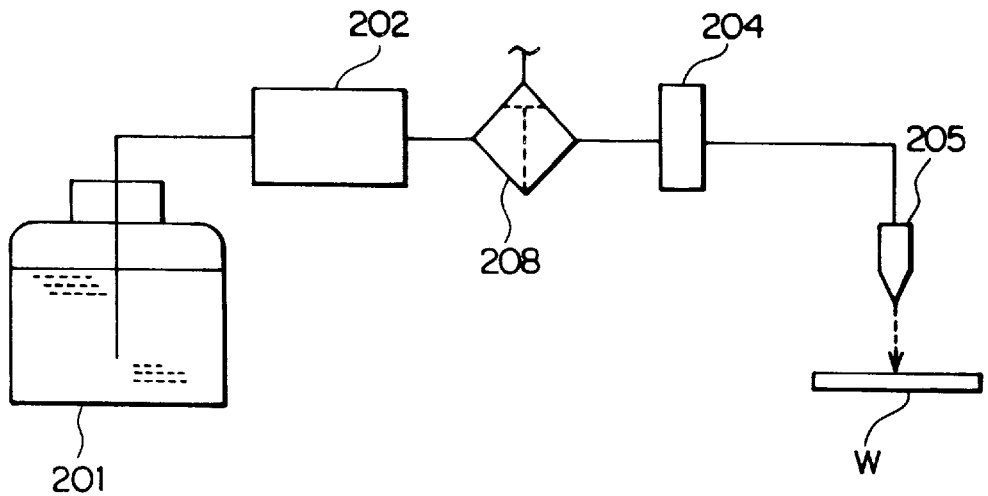
PRIOR ART FIG. 19
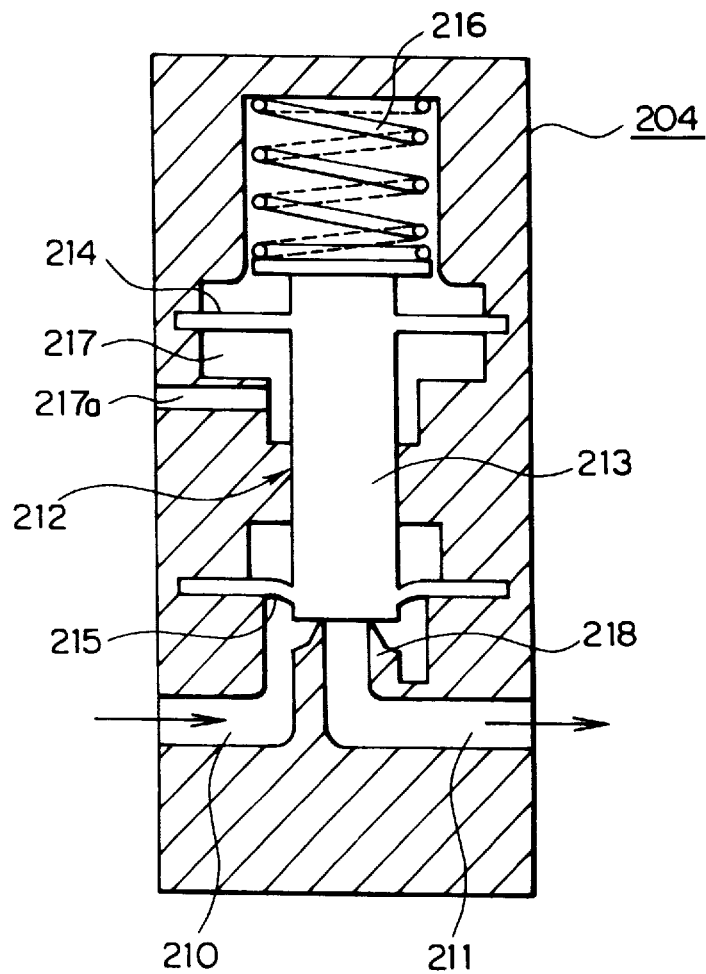

COATING UNIT

BACKGROUND OF THE INVENTION

1. Field of the Invention

The present invention relates to a coating unit for coating a surface of a treatment body such as a semiconductor wafer with a coating solution such as a resist solution.

2. Description of the Related Art

In a photolithography process of semiconductor device fabrication processes, for example, first, a resist coating treatment is performed to form a resist film on a surface of a semiconductor wafer (referred to as "a wafer" hereinafter) Next, after being resist-coated, the wafer is exposed and then developed.

A coating unit for performing a resist coating treatment is now taken up. A conventional coating unit has a structure shown in FIG. 18. Specifically, a resist solution kept in a resist tank 201 is pressed out to a nozzle with a pump 202. Meanwhile, timing for discharging the resist solution from a nozzle 205 is controlled by opening and closing a flow path of the resist solution with a valve 204 disposed between the pump 202 and the nozzle 205.

FIG. 19 is a schematic sectional view of an air operation-type valve 204 used in the aforementioned coating solution supplying mechanism.

The valve 204 used here is an air operation-type valve which makes opening and closing operation through compressed air.

In the valve 204, a cylinder 212 is disposed between a suction side flow path 210 and a discharge side flow path 211. Within the cylinder 212, a rod 213 is held to be movable vertically in FIG. 19 through diaphragms 214 and 215. The rod 213 is biased downward in FIG. 19 by a spring 216. An air chamber 217 is disposed in an upper portion of the cylinder 212 and under the diaphragm 214. The air chamber 217 is communicated with the outside through an operation port 217a. An air compressor (not shown) is connected to the operation port 217a by way of a solenoide valve (not shown).

When the solenoide valve is closed and compressed air is not sent from the air compressor, space between a lower end portion of the rod 213 and a gate portion 218 is closed by pressing force of the spring 216.

In order to work the valve 204, the solenoide valve is opened and compressed air from the air compressor is sent to the air chamber 217, whereupon the diaphragm 214 is transformed by force of the compressed air and the rod 213 is pushed up. Between the lower end of the rod 213 and the gate portion 218, space is formed so that the suction side flow path 210 and the discharge side flow path 211 are communicated with each other.

Incidentally, a coating solution of low viscosity is advantageous, because production cost can be lowered, a treatment body with a large area can be coated therewith, and the like. Therefore, a low viscosity-type coating solution containing more solvent or surface active agent than conventional coating solutions is mainly being used.

A low viscosity-type coating solution has, however, lower surface tension as compared with conventional coating solutions of relatively high viscosity. Thus, the low viscosity-type coating solution is easy to drip down from a forward end of a nozzle, and bubbles easily arise in the coating solution by air which enters from the forward end of the nozzle. Due to the aforementioned dripping and bubbles, thickness of a coating film changes and the quality of a treatment body easily deteriorates.

To prevent the aforementioned disadvantages, it is necessary to work a pump and a valve with a good response, to accurately open and close the valve in timing that dripping of a resist solution or bubbles do not arise, and to slowly perform the operation when the valve is closed.

A conventional air operation-type valve, however, has a structure that a valve body is driven through compressed air. Accordingly, operation is accompanied by delay time so that it is difficult to accurately control the time for working an opening and closing valve. Moreover, a conventional solenoide valve has difficulty in controlling the working speed at the time of opening and closing it. As a result, there appears a disadvantage that the occurrence of dripping or bubbles can not be completely prevented when a low viscosity-type coating solution is used.

SUMMARY OF THE INVENTION

The present invention is made to solve the aforementioned disadvantages. Specifically, an object of the present invention is to provide a coating unit which can accurately control the time for working an opening and closing valve and can slowly perform the operation when the valve is closed.

An object of the present invention is to provide a coating unit which does not increase in size and not complicate a conventional air operation-type valve, can accurately control the time for working an opening and closing valve, and can slowly perform the operation when the valve is closed.

An object of the present invention is to provide a coating unit which can completely prevent the occurrence of dripping or bubbles even when a low viscosity-type coating solution is used.

An object of the present invention is to provide a coating unit which does not increase in size and not complicate a conventional air operation-type valve and can completely prevent the occurrence of dripping or bubbles even when a low viscosity-type solution is used.

An object of the present invention is to provide a coating unit which is provided with a coating solution filter and can completely prevent the occurrence of dripping or bubbles even when a low viscosity-type solution is used.

An object of the present invention is to provide a coating unit which is provided with a coating solution filter, does not increase in size and not complicate a conventional air operation-type valve, and can completely prevent the occurrence of dripping or bubbles even when a low viscosity-type solution is used.

To solve the aforementioned problems, a first embodiment of a coating unit of the present invention in comprises: a tank for keeping a coating solution; a nozzle for discharging the coating solution supplied from the tank toward a treatment body; a pump disposed between the tank and the nozzle for pressing out the coating solution in the tank; and an opening and closing valve disposed between the pump and the nozzle for opening and closing a flow path of the coating solution by being driven electrically.

The opening and closing valve, of the first embodiment of the coating unit of the present invention, is driven by piezoelectric elements.

A second embodiment of the coating unit of the present invention comprises: a tank for keeping a coating solution; a nozzle for discharging the coating solution supplied from the tank toward a treatment body; a pump disposed between the tank and the nozzle for pressing out the coating solution in the tank, an opening and closing valve disposed between the pump and the nozzle for opening and closing a flow path of the coating solution by being driven electrically; and a suck-back valve disposed between the opening and closing valve and the nozzle for applying negative pressure to the coating solution in the flow path by being driven electrically after a lapse of the designated time after the opening and closing valve is closed.

The opening and closing valve and/or the suck-back valve of the second embodiment are driven by piezoelectric elements.

A third embodiment of the coating unit of the present invention comprises: a tank for keeping a coating solution; a nozzle for discharging the coating solution supplied from the tank toward a treatment body; a pump disposed between the tank and the nozzle; a filter disposed between the tank and the pump, and an opening and closing valve disposed between the pump and the nozzle for opening and closing a flow path of the coating solution by being driven electrically.

The filter of the third embodiment is built in a coating solution inflow side of the pump.

The opening and closing valve of the third embodiment is driven by piezoelectric elements.

A fourth embodiment of the coating unit of the present invention comprises: a tank for keeping a coating solution; a nozzle for discharging the coating solution supplied from the tank toward a treatment body; a pump disposed between the tank and the nozzle; a filter disposed between the tank and the pump; an opening and closing valve disposed between the pump and the nozzle for opening and closing a flow path of the coating solution by being driven electrically; and a suck-back valve, disposed between the opening and closing valve and the nozzle, for applying negative pressure to the coating solution in the flow path, by being driven electrically, after a lapse of the designated time, after the opening and closing valve is closed.

The opening and closing valve and/or the suck-back valve of the fourth embodiment are driven by piezoelectric elements.

The filter of the fourth embodiment is built in a coating solution inflow side of the pump.

A fifth embodiment of the coating unit of the present invention comprises: a tank for keeping a coating solution; two or more nozzles for discharging the coating solution supplied from the tank toward a treatment body; a pump disposed between the tank and the nozzle; a filter disposed between the tank and the pump; two or more opening and closing valves disposed between the pump and each of the nozzles for opening and closing a flow path of the coating solution by being driven electrically; and two or more suck-back valves, disposed between each of the opening and closing valves and each of the nozzles, for applying negative pressure to the coating solution in the flow path, by being driven electrically, after a lapse of the designated time, after the opening and closing valve is closed.

The opening and closing valves and/or the suck-back valves of the fifth embodiment are driven by piezoelectric elements.

The filter of the fifth embodiment is built in a coating solution inflow side of the pump.

The coating unit of the first embodiment includes a valve which is directly driven electrically as an opening and closing valve for opening and closing a flow path of a coating solution. Accordingly, the time for working the opening and closing valve can be accurately controlled. Besides, the speed of closing the opening and closing valve can be controlled in multiple steps.

The coating unit of the first embodiment also includes a valve which is driven by piezoelectric elements as an opening and closing valve. Accordingly, the time for working the opening and closing valve can be accurately controlled without increasing in size and complicating a conventional air operation-type valve. Besides, the speed of closing the opening and closing valve can be controlled in multiple steps.

The coating unit of the second embodiment includes a valve which is directly driven electrically as an opening and closing valve and in addition a valve which is directly driven electrically as a suck-back valve. Thus, the occurrence of dripping or bubbles can be completely prevented even when a low viscosity-type coating solution is used.

The coating unit of the second embodiment also includes a valve which is driven by piezoelectric elements as an opening and closing valve and/or a suck-back valve. Hence, even when a low viscosity-type coating solution is used, the occurrence of dripping or bubbles can be completely prevented without increasing in size and complicating a conventional air operation-type valve.

The coating unit of the third embodiment uses a pump with a built-in filter disposed the aforementioned tank and the pump and includes a valve which is directly driven electrically as an opening and closing valve. Therefore, a coating unit, which can completely prevent the occurrence of dripping or bubbles eve n when a filter is disposed and a low viscosity-type coating solution is used, can be provided.

The coating unit the third embodiment also uses a filter which is built in a coating solution inflow side of the pump as the filter in the coating unit. Accordingly, the filter can be attached without increasing, not only the pump, but also the whole coating unit in size.

The coating unit in of the third embodiment also includes a valve driven by piezoelectric elements as an opening and closing valve and/or a suck-back valve. Therefore, a coating unit, which can completely prevent the occurrence of dripping or bubbles without increasing in size and complicating a conventional air operation-type valve even when a filter is disposed and a low viscosity-type coating solution is used, can be provided.

The coating unit of the fourth embodiment, in which a filter is disposed between the tank and the pump, includes a valve which is directly driven electrically as an opening and closing valve and in addition includes a valve which is directly driven electrically as a suck-back valve. Thus, a coating unit, which can completely prevent the occurrence of dripping or bubbles even when a filter is disposed and a low viscosity-type coating solution is used, can be provided.

The coating unit of the fourth embodiment also includes a valve driven by piezoelectric elements as an opening and closing valve and/or a suck-back valve. Accordingly, a coating unit, which can completely prevent the occurrence of dripping or bubbles without increasing in size and complicating a conventional air operation-type valve even when a filter is disposed and a low viscosity-type coating solution is used, can be provided.

The coating unit of the fourth embodiment also uses a filter which is built in a coating solution inflow side of the pump as the filter in the coating unit. Therefore, the filter can be attached without increasing not only the pump but also the whole coating unit in size.

The coating unit of the fifth embodiment includes two or more nozzles, two or more opening and closing valves, and two or more suck-back valves and can individually and independently perform discharge or suck-back from each nozzle. Accordingly, a coating solution or a solvent can be discharged from plural nozzles at separate time, which makes minute discharge possible.

The coating unit of the fifth embodiment also includes a valve driven by piezoelectric elements as an opening and closing valve and/or a suck-back valve. Thus, a coating unit, which can completely prevent the occurrence of dripping or bubbles without increasing in size and complicating a conventional air operation-type valve even when a filter is disposed and a low viscosity-type coating solution is used, can be provided.

The coating unit of the fifth embodiment also uses a filter which is built in a coating solution inflow side of the pump as the filter in the coating unit. Therefore, the filter can be attached without increasing, not only the pump, but also the whole coating unit in size.

BRIEF DESCRIPTION OF THE DRAWINGS

FIG. 18 is a schematic block diagram of a coating solution supplying system which uses a conventional air operation-type valve; and FIG. 19 is a vertical sectional view of the conventional air operation-type valve.

DESCRIPTION OF PREFERRED EMBODIMENT

The preferred embodiment of the present invention will now be described in detail with reference to the drawings.

Figure 1:
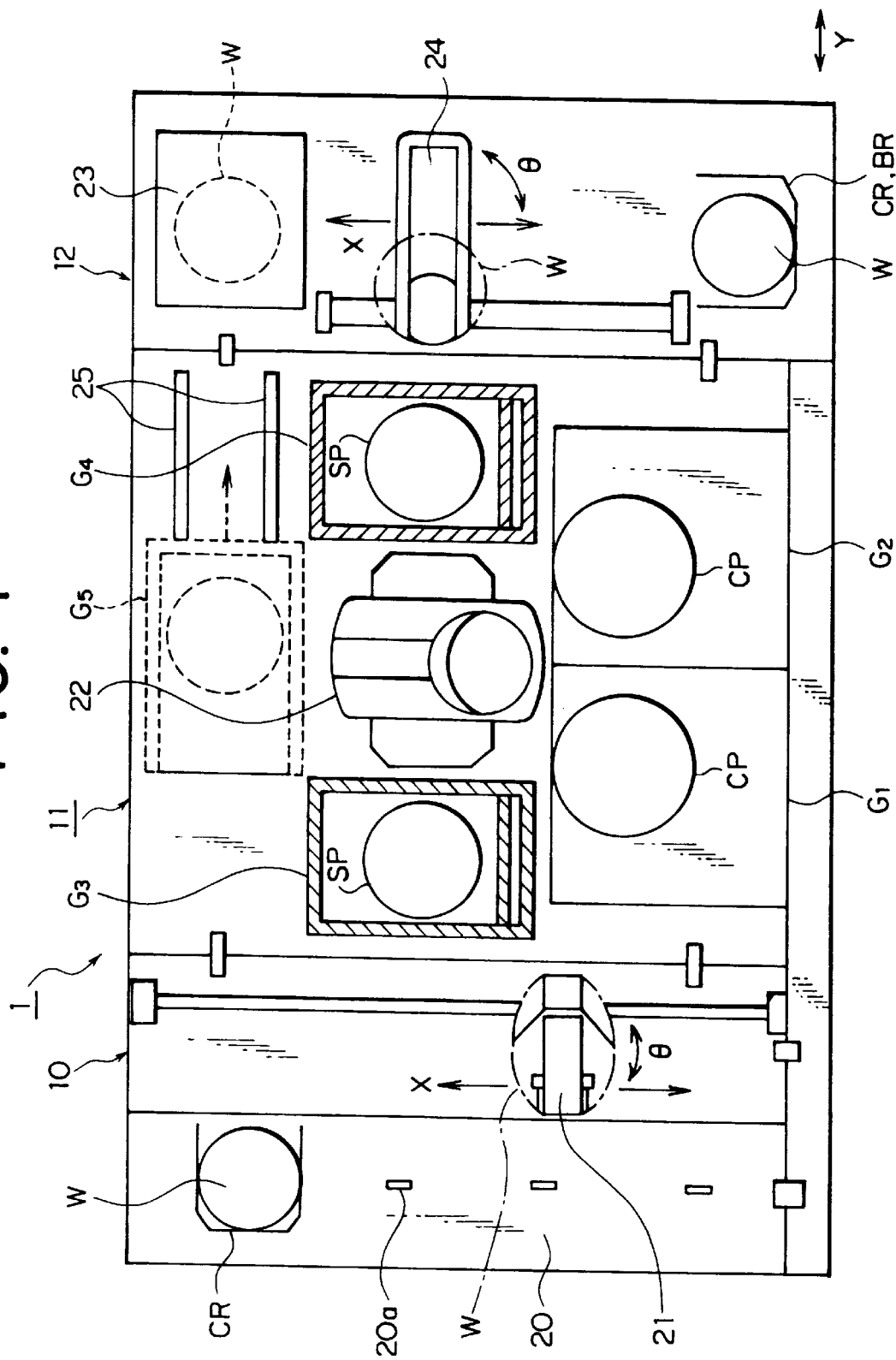
FIG. 1 is a plane view of a coating and developing system provided with a resist coating unit according to an embodiment of the present invention.

FIG. 1 is a plane view showing an entire coating and developing system 1 for a semiconductor wafer (referred to as "a wafer" hereinafter) provided with a resist coating unit (COT) according to an embodiment of the present invention.

In the coating and developing system 1, a cassette station 10, a treatment station 11, and an interface unit 12 are integrally connected. In the cassette station 10, plural wafers W as treatment bodies, for example, twenty-five wafers per wafer cassette CR are transferred to/from the system from/to the outside, and the wafer W is transferred to/from the wafer cassette CR.

In the treatment station 11, various kinds of treatment units are multi-tiered in the predetermined position. Each treatment unit performs the predetermined treatment for wafers W one by one in a coating and developing process.

In the interface unit 12, the wafer W is sent and received to/from an exposing unit (not shown) which is disposed adjacent to the treatment station 11.

In the cassette station 10, more than one, for example, up to four wafer cassettes CR are set at the position of each positioning projection 20a on a cassette stand 20. The wafer cassettes CR are disposed with each way in/out for wafers thereof opening to the treatment station 11 side in a line in a X-direction (vertical direction in FIG. 1). A wafer transferring body 21, which can move in the alignment direction of cassettes (X-direction) and in the alignment direction of the wafers W (Z-direction; vertical direction) kept in the wafer cassette CR, is selectively accessible to each wafer cassette CR.

The wafer transferring body 21 is rotatable in a θ direction and also accessible to an alignment unit (ALIM) or an extension unit (EXT) which is disposed in a multi-tiered units of a third treatment unit group G3 in the treatment station 11 side as described later.

In the treatment station 11, a vertical transferring type of main wafer transferring mechanism 22 including a wafer transferring unit is provided. Around the mechanism 22, one set or more than one set of all treatment units are multi-tiered.

Figure 2:
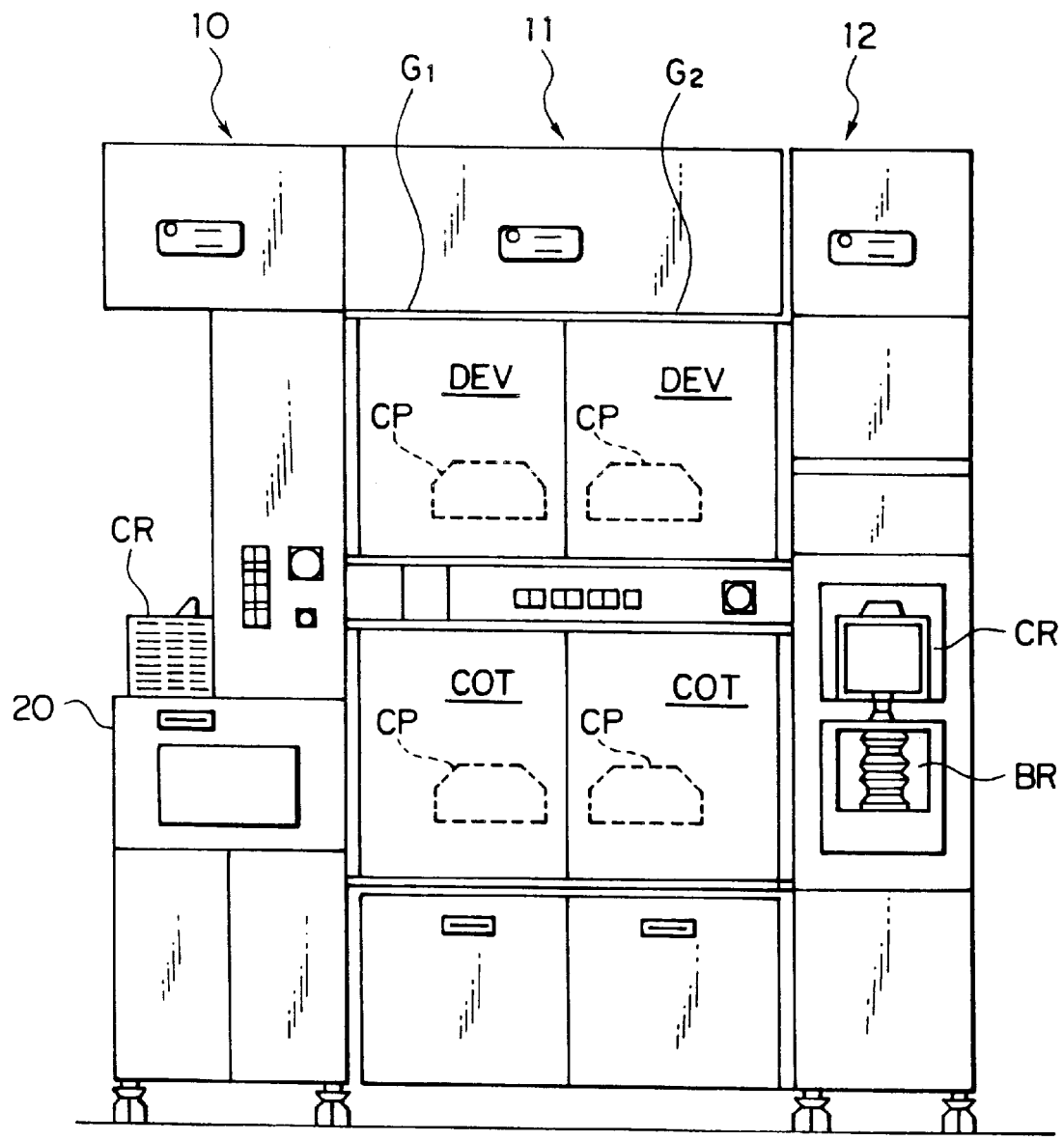
FIG. 2 is a front view of the coating and developing system provided with the resist coating unit according to an embodiment of the present invention.

FIG. 2 is a front view of the coating and developing system 1.

In a first treatment unit group G1, two spinner-type treatment units such as a resist coating unit (COT) and a developing unit (DEV) in which a wafer W is put on a spin chuck in a cup CP to perform the predetermined treatment are dual-stacked in order from the bottom. In a second treatment unit group G2, two spinner type-treatment units, for example, the resist coating unit (COT) and the developing unit (DEV) are dual-stacked in order from the bottom. The resist coating unit (COT) has difficulty in drainage of a resist solution in respect of structure and maintenance. Therefore, the resist coating unit (COT) is preferably disposed in a lower tier. It is, however, possible to properly dispose it in an upper tier, if necessary.

Figure 3:
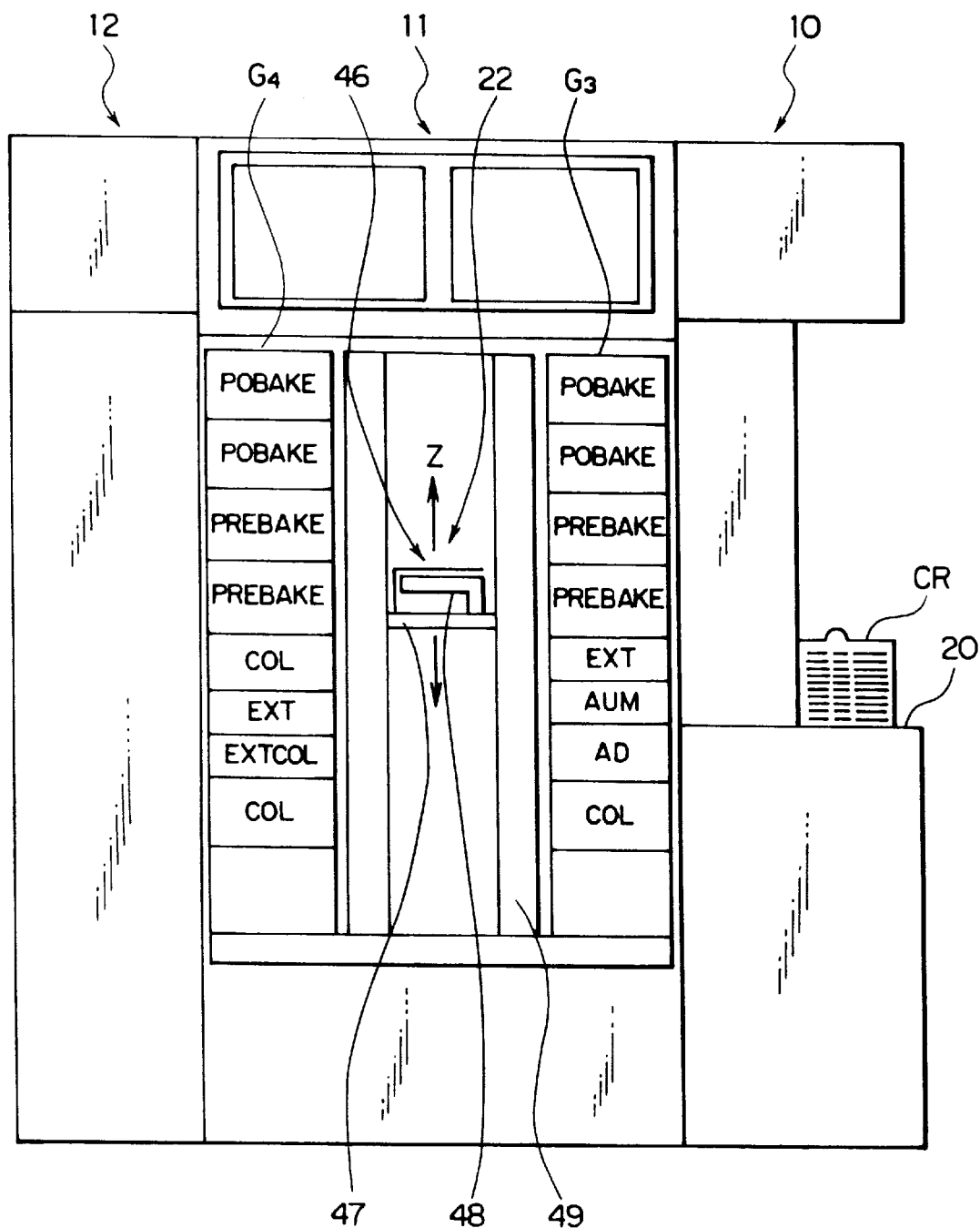
FIG. 3 is a rear view of the coating and developing system provided with the resist coating unit according to an embodiment of the present invention.

FIG. 3 is a rear view of the aforementioned coating and developing system 1.

In the main wafer transferring mechanism 22, a wafer transferring unit 46 is provided within a cylindrical supporting body 49 so as to freely ascend and descend in a vertical direction (Z-direction). The cylindrical supporting body 49 is connected to a rotational shaft of a motor (not shown), and rotates on the rotational shaft integrally with the wafer transferring unit 46 by rotation driving force of the motor. Thus, the wafer transferring unit 46 is rotatable in a θ direction. Incidentally, the cylindrical supporting body 49 can be also connected to another rotational shaft (not shown) rotated by the aforementioned motor.

Disposed in the wafer transferring unit 46 are a plurality of holding members 48 movable in the direction to the front and the rear of a transferring stand 47. The holding members 48 make it possible to transfer the wafer W between treatment units.

As shown in FIG. 1, in the coating and developing system 1, five treatment unit groups G1, G2, G3, G4, and G5 can be disposed. Multi-tiered units of the first and the second treatment unit groups G1 and G2 are disposed in the front side (the lower side of FIG. 1) of the system. Multi-tiered units of the third treatment group G3 are disposed adjacent to the cassette station 10. Multi-tiered units of a fourth treatment unit group G4 are disposed adjacent to the interface unit 12. Multi-tiered units of a fifth treatment unit group G5 can be disposed in the rear side.

As shown in FIG. 3, in the third treatment unit group G3, oven-type treatment units in which the wafer W is put on a holding stand (not shown) to perform the predetermined treatment, for example, a cooling unit (COL) for performing cooling treatment, an adhesion unit (AD) for performing hydrophobic treatment to improve fixing characteristic of the resist, an alignment unit (ALIM) for alignment, an extension unit (EXT), a prebaking unit (PREBAKE) for performing heat treatment before exposing treatment, and a postbaking unit (POBAKE) for performing heat treatment after exposing treatment are, for example, eight-tiered in order from the bottom. Similarly, in the fourth treatment unit group G4, oven-type treatment units, for example, a cooling unit (COL), an extension & cooling unit (EXTCOL), an extension unit (EXT), a cooling unit (COL), a prebaking unit (PREBAKE), and a postbaking unit (POBAKE) are, for example, eight-tiered in order from the bottom.

As described above, the cooling unit (COL) and the extension & cooling unit (EXTCOL), both requiring low treatment temperature, are disposed below, and meanwhile the prebaking unit (PREBAKE), the postbaking unit (POBAKE), and the adhesion unit (AD), all of three requiring high treatment temperature, are disposed above, thereby reducing thermal mutual interference between the units. Random multi-tiered disposition is naturally possible.

As shown in FIG. 1, the interface unit 12 has the same dimension in the direction of depth (X-direction) as the treatment station 11, but has smaller dimension in the direction of width (Y-direction). A portable pickup cassette CR and a fixed buffer cassette BR are two-tiered in a front portion of the interface unit 12. Meanwhile, a peripheral exposing unit 23 is disposed in a rear portion thereof, and a wafer transferring body 24 is disposed in a center portion thereof. The wafer transferring body 24 moves in a X-direction and a Z-direction to be accessible to both of the cassettes CR and BR, and the peripheral exposing unit 23.

The wafer transferring body 24 is also rotatable in a θ direction. The wafer transferring body 24 is also accessible to the extension unit (EXT) disposed in the multi-tiered units of the fourth treatment unit group G4 in the treatment station 11 side, or a wafer delivery stand (not shown) in the side of the adjacent exposing unit.

In the coating and developing system 1, as described above, the multi-tiered units of the fifth treatment unit group G5 shown in a broken line in FIG. 1 can be also disposed in the rear side of the main wafer transferring mechanism 22. The multi-tiered units of the fifth treatment unit group G5 are movable in a Y-direction along a guide rail 25. Therefore, even when the multi-tiered units of the fifth treatment unit group GS are provided as shown in FIG. 1, a space portion can be secured, since the multi-tiered units move along the guide rail 25, which facilitates maintenance working for the main wafer transferring mechanism 22 from behind.

Next, the resist coating unit (COT) according to the present embodiment will be described.

Figure 4:
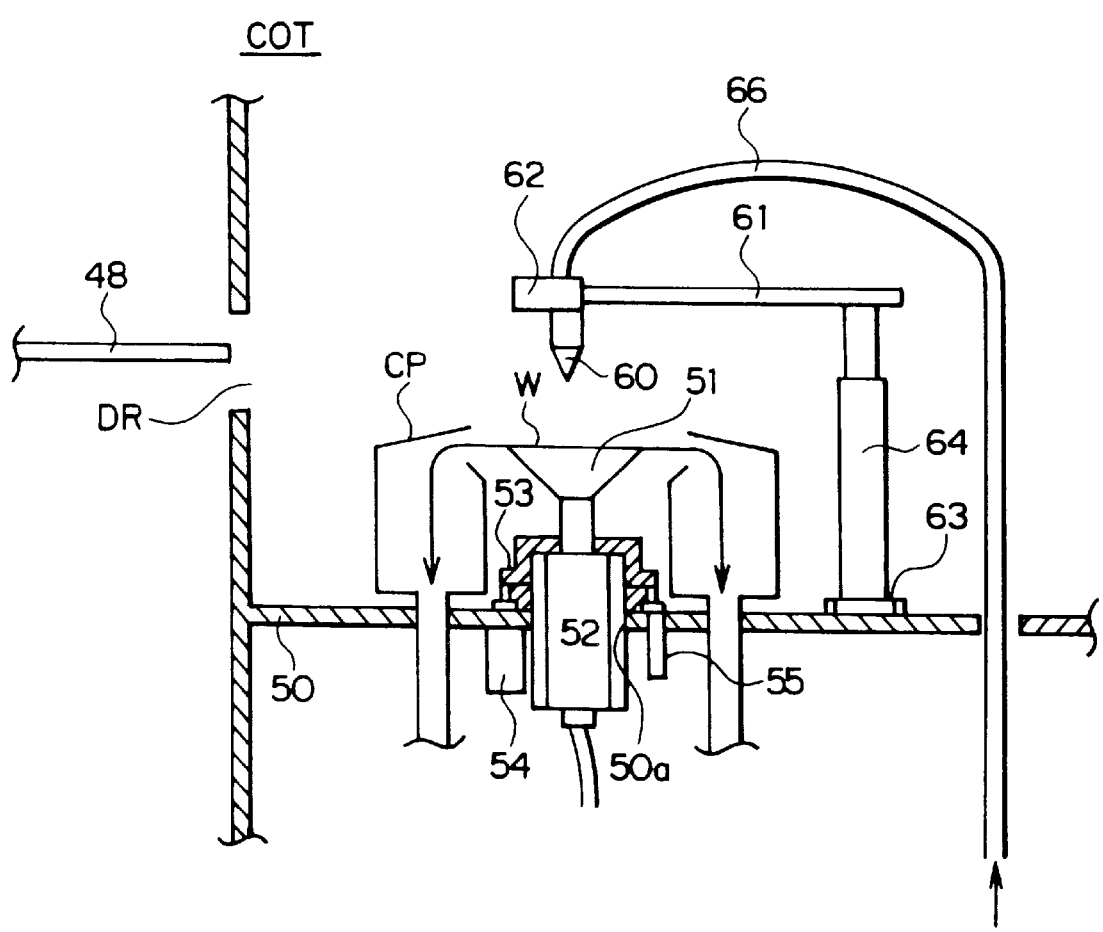
FIG. 4 is a sectional view of the resist coating unit according to an embodiment of the present invention.

FIG. 4 is a schematic sectional view of the resist coating unit (COT) according to the present embodiment.

An annular cup CP is disposed in a center portion of the resist coating unit (COT). A spin chuck 51 is disposed within the cup CP. The spin chuck 51 is rotationally driven by a drive motor 52 while fixing and holding the wafer W by means of vacuum adsorption.

The drive motor 52 is disposed to be able to move up and down to an opening 50a formed in a unit baseplate 50, the drive motor 52 being joined to a driving means for ascent and descent 54 and a guide means for ascent and descent 55 which consist of air cylinders, for example, through a cap-shaped flange member 53 which is made of aluminum, for example.

A resist nozzle 60 for discharging a resist solution as a coating solution toward a surface of the wafer W is detachably attached to an end portion of a resist nozzle scanning arm 61 through a nozzle holding body 62. The resist nozzle scanning arm 61 is attached to an upper end portion of a vertical supporting member 64 which is horizontally movable on a guide rail 63 which is laid on the unit base plate 50 in one direction (Y-direction). The resist nozzle scanning arm 61 moves in a Y-direction integrally with the vertical supporting member 64 by means of a Y-direction driving mechanism (not shown).

Figure 5:
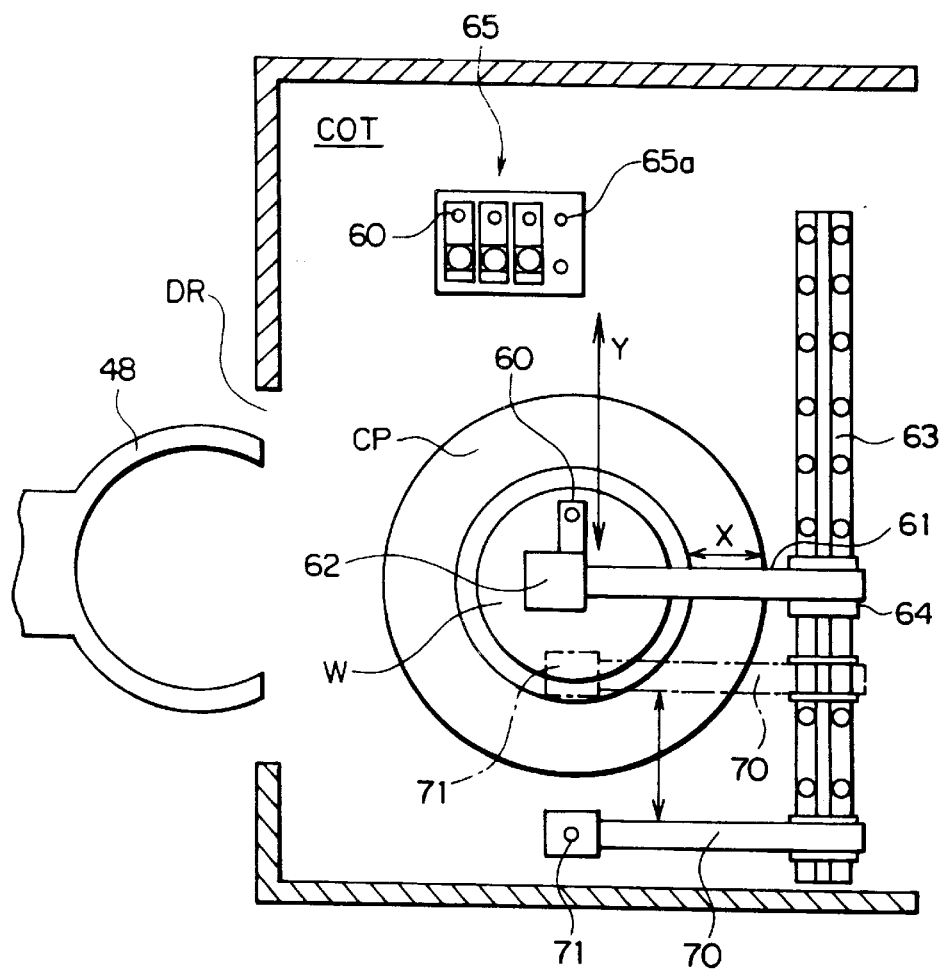
FIG. 5 is a plane view of the resist coating unit according to an embodiment of the present invention.

FIG. 5 is a schematic plane view of the resist coating unit (COT) according to the present embodiment.

The resist nozzle scanning arm 61 also can move in a X-direction perpendicular to a Y-direction so as to selectively attach the resist nozzle 60 thereto in a resist nozzle standby unit 65, and also can move in a X-direction by means of a X-direction driving mechanism (not shown).

In the resist nozzle stand by unit 65, a discharge opening of the resist nozzle 60 is inserted into an opening 65a of a solvent atmosphere chamber where the discharge opening is exposed to atmosphere of a solvent, thus preventing a resist solution at a forward end of the resist nozzle 60 from solidifying and deteriorating. Moreover, a plurality of resist nozzles 60, 60, . . . are provided so that a suitable resist nozzle 60 can be selected according to a kind and viscosity of a resist solution.

Disposed on the guide rail 63 are the vertical supporting member 64 for supporting the resist nozzle scanning arm 61 and a vertical supporting member 71 movable in a Y-direction for supporting a rinse nozzle scanning arm 70.

The rinse nozzle scanning arm 70 moves translationally or rectilinearly between a rinse nozzle standby position (a solid line position) set on the side of the cup CP and a rinse solution discharge position (a dotted line position) set directly above a peripheral portion of the semiconductor wafer W mounted on the spin chuck 51.

As shown in FIG. 4, the resist nozzle 60 is connected to a resist solution supplying mechanism disposed within a lower chamber of the resist coating unit (COT) through a resist supplying pipe 66.

Figure 6:
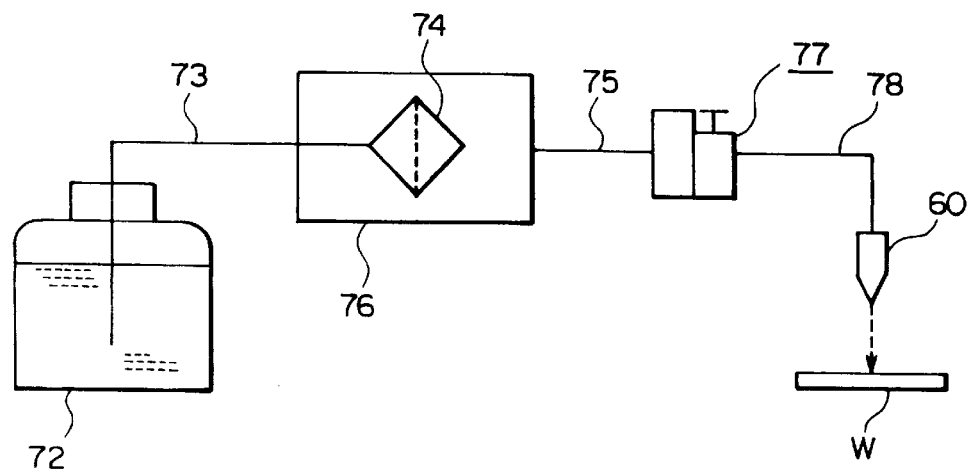
FIG. 6 is a schematic block diagram of a resist solution supplying mechanism in the resist coating unit according to an embodiment of the present embodiment.

FIG. 6 is a schematic block diagram of the resist solution supplying mechanism in the resist coating unit (COT) according to the present embodiment.

In the resist solution supplying mechanism in the resist coating unit (COT) according to the present embodiment, a pump 76 for pressing out a resist solution in a resist tank 72 is disposed between the resist tank 72 for keeping the resist solution and the resist nozzle 60 for discharging the resist solution supplied from the resist tank 72 to the wafer W. Disposed between the pump 76 and the resist nozzle 60 is a valve 77 which opens and closes a flow path between a flow path 75 and a flow path 78 of the resist solution by being driven electrically.

Figure 7:
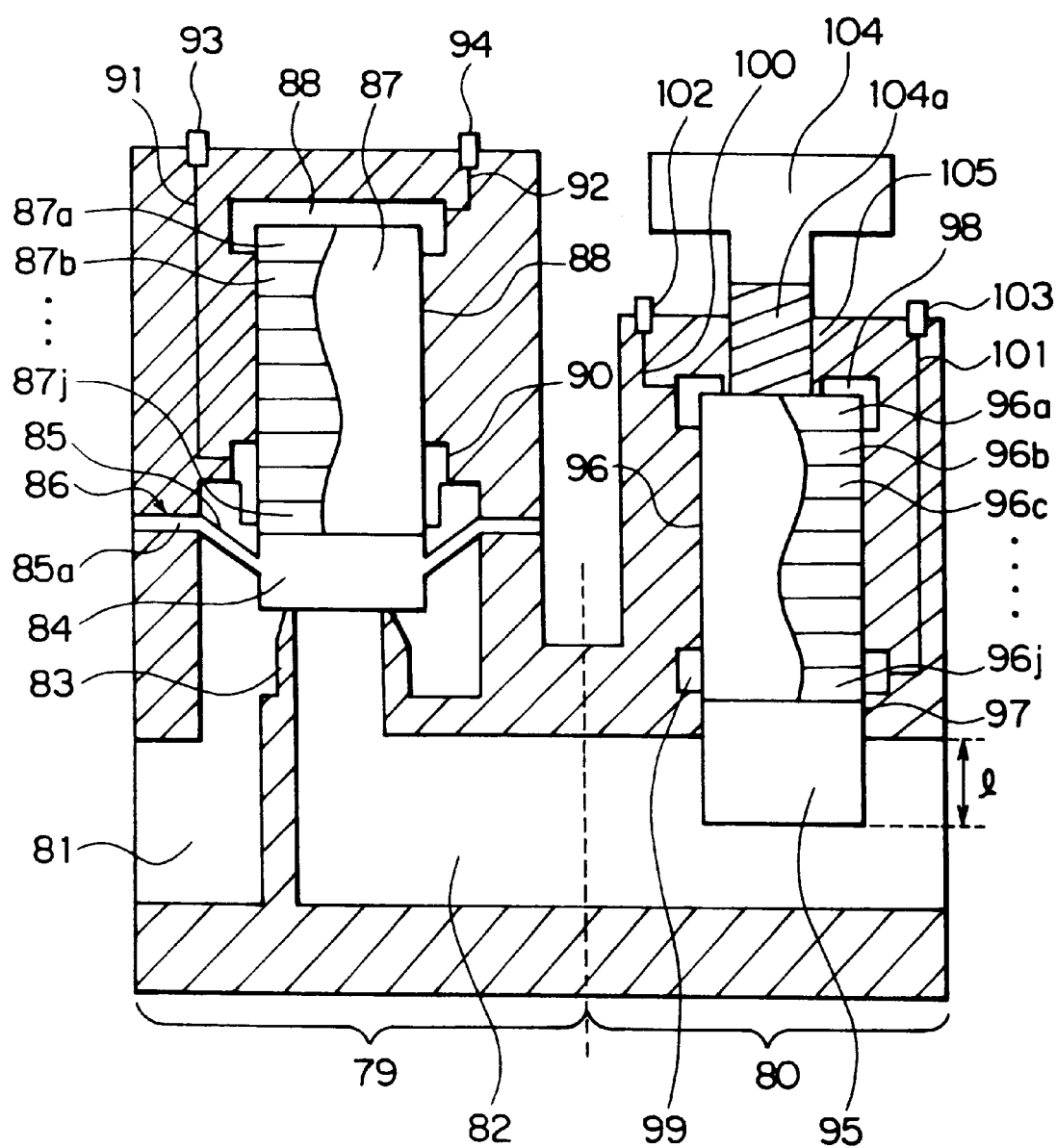
FIG. 7 is a vertical sectional view of a valve according to an embodiment of the present invention.

FIG. 7 is a vertical sectional view of the valve 77 in the resist coating unit (COT) according to the present embodiment.

In the valve 77 used in the resist coating unit (COT) according to the present embodiment, in addition to an opening and closing valve 79 for opening and closing a flow path of the resist solution, a suck-back valve 80 is disposed on the lower reaches side in a moving direction of the resist solution of the opening and closing valve 79.

The opening and closing valve 79 is provided with an inflow side flow path 81 and a discharge side flow path 82.

The inflow side flow path 81 and the discharge side flow path 82 are disposed adjacent to each other through a tubular gate portion 83 which tapers off to a point. A valve body 84 made of a flexible material, for example, silicone rubber is disposed to abut on an upper end surface in FIG. 7 of the gate portion 83. A diaphragm portion 85 is extended like a flange from the side of the valve body 84. An outer peripheral end portion 85*a* thereof is joined to a slot portion 86 formed in the side of a body of the opening and closing valve 79.

A rod 87 is disposed in the upper side in FIG. 7 of the valve body 84. The rod 87 is formed by laminating a plurality of disc-shaped piezoelectric elements, for example, ten piezoelectric elements 87*a* to 87*j* in a vertical direction in FIG. 7 and as a whole has a column-shape. Each of the piezoelectric elements 87*a* to 87*j* is formed so that the maximum expansion and contraction direction will be vertical in FIG. 7 when applied voltage is changed. The piezoelectric elements 87*a* to 87*j* are electrically connected to each other and at the same time are mechanically joined leaving no space between each other. Accordingly, when the voltage applied between the piezoelectric elements 87*a* and 87*j* at both ends in a vertical direction from the same power supply is changed, each of the piezoelectric elements 87*a* to 87*j* expands and contracts in a vertical direction in FIG. 7. As a result, the rod 87 expands and contracts ten times as long as one of the piezoelectric elements 87*a* to 87*j* does. When applied voltage is increased, the piezoelectric elements 87*a* to 87*j* expand, and when applied voltage is dropped, the piezoelectric elements 87*a* to 87*j* contract.

The rod 87 is contained and held within a column-shaped cylinder 88 formed in the side of the body of the opening and closing valve 79. Electrodes 89 and 90 for applying voltage to the piezoelectric elements 87*a* and 87*j* disposed at both ends of the rod 87 are disposed at an upper end portion and a lower end portion in FIG. 7 of the cylinder 88, respectively.

The electrodes 89 and 90 are respectively connected to terminals 93 and 94 which are disposed on an upper portion of the opening and closing valve 79 through wires 91 and 92 passing inside the opening and closing valve 79. The terminals 93 and 94 are connected to a power supply (not shown) through a controller (not shown).

The discharge side flow path 82 is extended from the opening and closing valve 79 side to the suck-back valve 80. Held in the discharge side flow path 82 in the suck-back valve 80 is a column-shaped piston 95 with a part thereof projecting from above in FIG. 7. A rod 96 with the same diameter as the piston 95 is disposed in the upper side in FIG. 7 of the piston 95. An upper face of the piston 95 and a lower face of the rod 96 are joined with each other.

The rod 96 has approximately the same structure as the aforementioned rod 87 has. Specifically, the rod 96 is formed by laminating a plurality of disc-shaped piezoelectric elements, for example, ten piezoelectric elements 96*a* to 96*j* in a vertical direction in FIG. 7 and as a whole has a column-shape. Each of the piezoelectric elements 96*a* to 96*j* is formed so that the maximum expansion and contraction direction will be vertical in FIG. 7 when applied voltage is changed. The piezoelectric elements 96*a* to 96*j* are electrically connected to each other and at the same time are mechanically joined leaving no space between each other. Accordingly, when the voltage applied between the piezoelectric elements 96*a* and 96*j* at both ends from the same power supply is changed, each of piezoelectric elements 96*a* to 96*j* expands and contracts in a vertical direction in FIG. 7. As a result, the rod 96 expands and contracts ten times as long as one of the piezoelectric elements 96*a* to 96*j* does. When applied voltage is increased, the piezoelectric elements 96*a* to 96*j* expand, and when applied voltage is dropped, the piezoelectric elements 96*a* to 96*j* contract. The rod 96 is contained and held within a column-shaped cylinder 97 formed in the side of a body of the suck-back valve 80. Electrodes 98 and 99 for applying voltage to the piezoelectric elements 96*a* and 96*j* disposed at both ends of the rod 96 are disposed at an upper end portion and a lower end portion in FIG. 7 of the cylinder 97, respectively. The electrodes 98 and 99 are respectively connected to terminals 102 and 103 which are disposed on an upper portion of the suck-back valve 80 through wires 100 and 101 passing inside the suck-back valve 80. The terminals 102 and 103 are connected to the power supply (not shown) through the controller (not shown).

A projecting volume controlling member 104 is disposed on the upper side in FIG. 7 of the rod 96. A male screw 104*a* is formed in a lower portion of the projecting volume controlling member. Meanwhile, a female screw 105 is formed to mesh with the male screw 104*a* in an upper portion in FIG. 7 of the cylinder 97. The projecting volume controlling member 104 moves in a vertical direction in FIG. 7 by rotating the projecting volume controlling member 104. Thus, a lower portion of the projecting volume controlling member 104 raises and lowers the rod 96 and the piston 95, whereby projecting volume (represented by 1 in FIG. 7) of the piston 95 is controlled.

Next, a pump used in the coating unit according to the present embodiment will be described.

Figure 8:
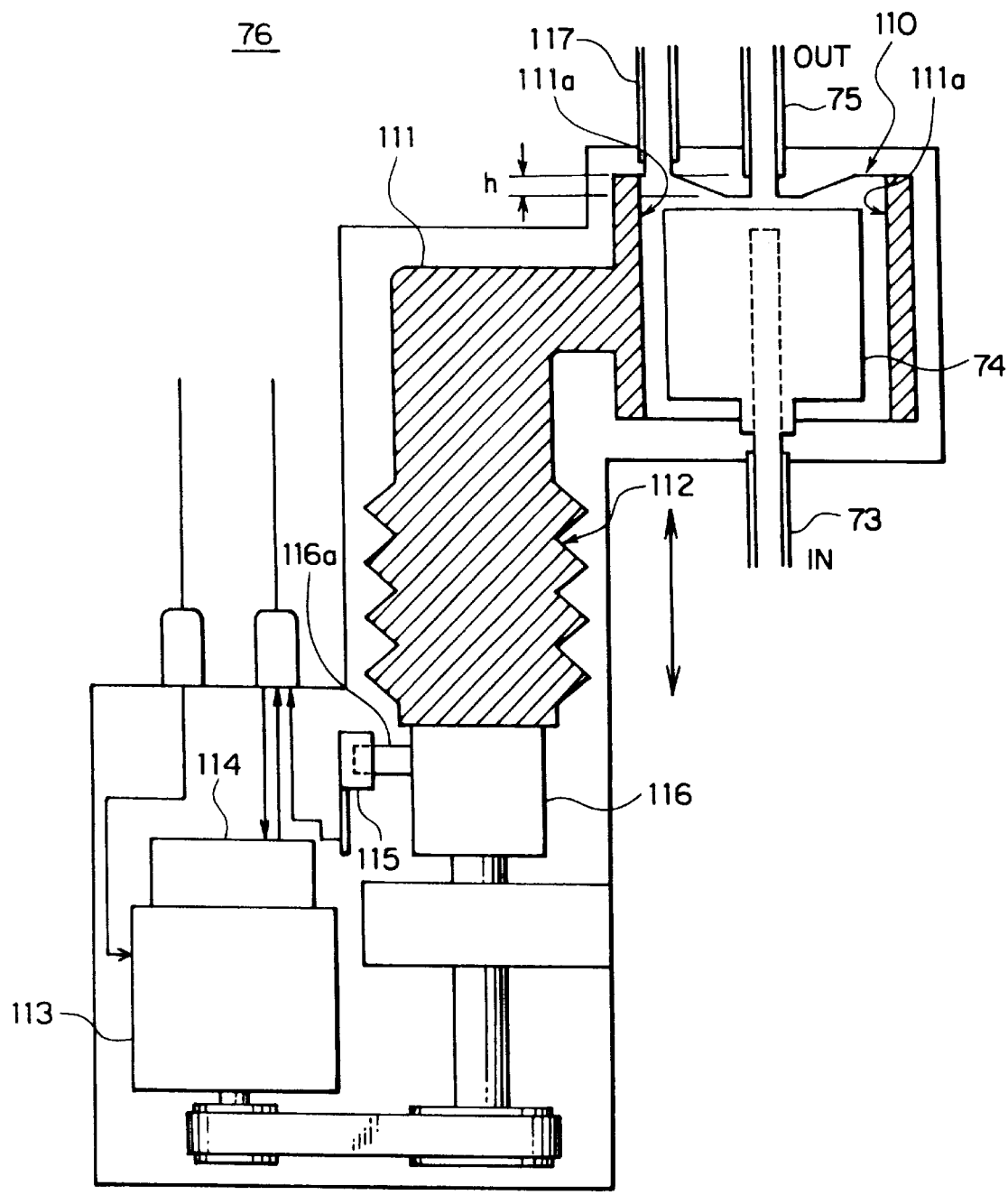
FIG. 8 is a detail drawing of a pump used in the resist coating unit according to an embodiment of the present invention.

FIG. 8 is a detail drawing of the pump 76 used in the coating unit according to the present embodiment. The pump 76 is a bellows pump integral with a filter. The pump 76 uses a tubephragm mechanism for sucking and discharging a resist solution by changing pressure within a pump room 110 with change of indoor capacity as a mechanism for pressing out a solution.

In the pump 76, the pump room 110 is approximately column-shaped. A peripheral inwall of the pump room 110 is formed of an elastic film 111a of a tubephragm 111 into which a fluid (a solution) is sealed, for example, consisting of PFA. The peripheral inwall of the pump room 110 expands and contracts with expansion and contraction motion of a bellows portion 112 of the tubephragm 111. With the expansion and contraction motion, the capacity and pressure of the pump room 110 can be changed.

The bellows portion 112 is driven to expand and contract with high accuracy by power of a motor, for example, a stepping motor 113. Working timing or speed of expansion and contraction of the stepping motor 113, that is, sucking and discharging timing or sucking and discharging speed of a resist solution is controlled by a controller (not shown) according to setting conditions. An encoder 114 is connected to the stepping motor 113. With the encoder 114, working amount of the stepping motor 113 is fed back to the controller.

115 in FIG. 8 is a light transmission-type sensor. The light transmission type-sensor 115 detects, for example, a starting position or an ending position of expansion and contraction of the bellows portion 112 by interfering with a shutter member 116a attached to a movable supporting portion 116 of the bellows portion 112. The detect signal is outputted to the controller to serve control of the stepping motor 113.

Connected to the pump room 110 is a suction pipe 73 for sucking a resist solution into the pump room 110 with a plenty of through-holes formed on a peripheral surface of an end portion thereof opening into a filter 74. Meanwhile, a discharge pipe 75 is connected to the pump room 110,the pipe opening into space outside the filter within the pump room 110. Specifically, in the bellows pump 76 integral with the filter, the resist solution passes through the filter 74 in the process of suction by pressure reduction in the pump room 110 so as to be filtered. When pressure is applied in the pump room 110, the resist solution which is already filtered is discharged. Ball-type check valves (not shown) for preventing back flow are respectively disposed around openings of the suction pipe 73 and the discharge pipe 75.

Teflon oil, other oil, or moreover liquid such as purified water is desirable as fluid sealed into the tubephragm 111. Secular change of capacity in the tubephragm 111 can be held down by sealing liquid into the tubephragm 111 more than by sealing gas thereinto. Thus, long-term stabilization of characteristics of expansion and contraction in a peripheral inwall surface of the pump room 110 can be obtained.

In addition, the tubephragm pump 76 integral with the filter is provided with a vent 117 for bubbles opening to space outside the filter 74 within the pump room 110.

A difference of height h is provided between an opening of the vent 117 and an opening of the discharge pipe 75. Therefore, bubbles which arise in the pump room 110 remain in a position higher than the opening of the discharge pipe 75, and from the above position the bubbles are exhausted through the vent for bubbles 117. As a result, bubbles has difficulty in entering into the discharge pipe 75, thereby reducing the amount of bubbles in the resist solution supplied to the wafer W.

Incidentally, a valve (not shown) is connected to the vent for bubbles 117. Hence, bubbles remaining in the upper portion within the pump room 110 can be exhausted by opening the valve periodically, for example, every time the resist tank 72 is exchanged.

Figure 9:
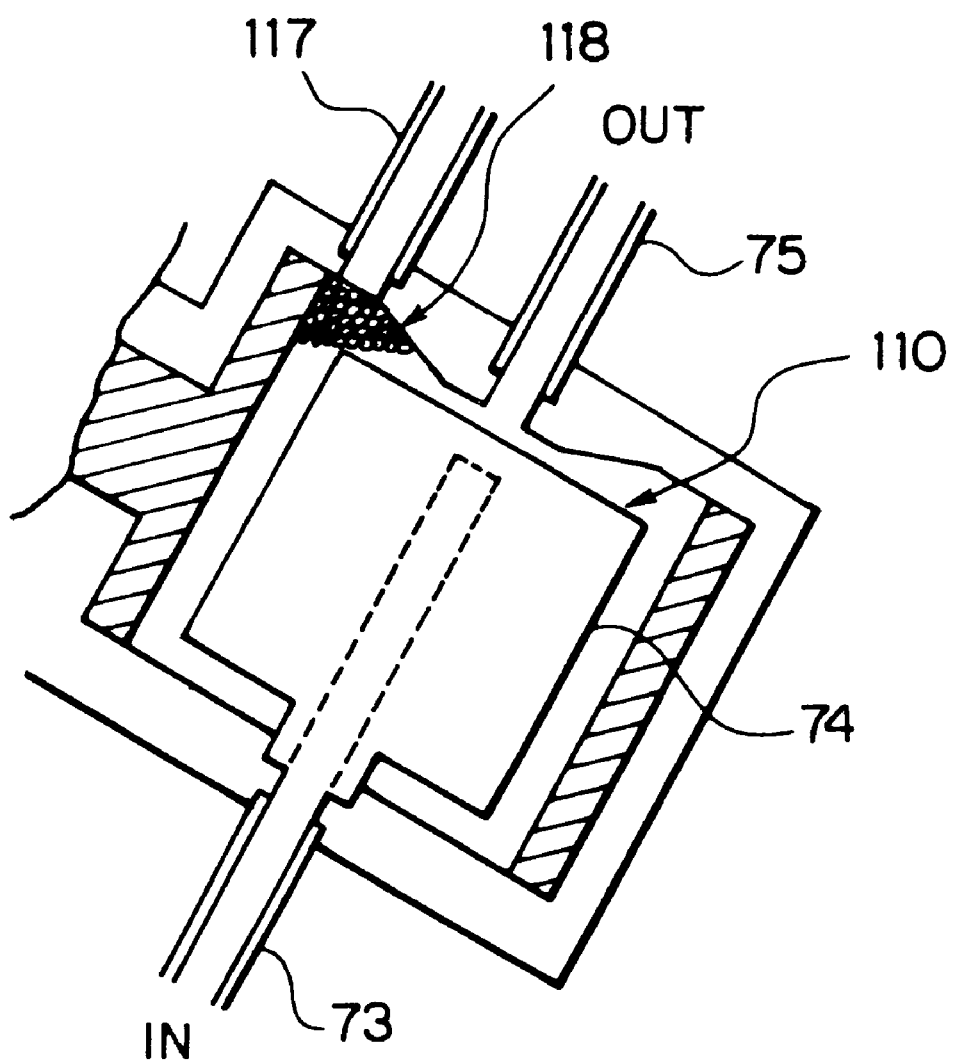
FIG. 9 is a schematic view showing an attaching state of a built-in filter used in the resist coating unit according to an embodiment of the present invention.

The aforementioned tubephragm pump 76 integral with the filter is desirably disposed slantwise relative to a horizontal level so that a position of the opening of the vent for bubbles 117 can be in the vicinity of the top as shown in FIG. 9. Consequently, bubbles 118 in the pump room 110 concentrate in the vicinity of the opening of the vent for bubbles 117, which makes it possible to efficiently exhaust bubbles.

Next, the workings of the coating and developing system 1 with the above structure will be described.

When the coating and developing system 1 provided with the resist coating unit (COT) according to the present embodiment starts, the wafer W is taken out from the wafer cassette CR. After the wafer W is transferred by the main wafer transferring mechanism 22 and adsorbed and held on the spin chuck 51 in the resist coating unit (COT), the following resist coating operation starts.

First, the spin chuck 51 rotates to rotate the wafer W. At the same time, a thinner discharging mechanism (not shown) operates to discharge thinner toward the wafer W from a position directly above the nearly center of the wafer W. The dripped thinner is spread out over the whole surface of the wafer W by centrifugal force. Excess thinner is eliminated by being swung around by centrifugal force.

Next, the resist nozzle scanning arm 61 moves to move the resist nozzle 60 to a position directly above the nearly center of the wafer W. At this position, a resist solution is dripped down from the resist nozzle 60. Similarly to the aforementioned thinner, the dripped resist solution is spread out over the whole surface of the wafer W by centrifugal force. Excess resist solution is eliminated by being swung around by centrifugal force.

Subsequently, the wafer W is taken out from the resist coating unit (COT) and transferred to a succeeding treatment unit, for example, to a drying unit.

Now, the workings of the resist solution supplying mechanism in the resist coating unit (COT) according to the present embodiment will be described. As shown in FIG. 6, a resist solution in the resist tank 72 is sucked into the pump 76 through the pipe 73. Thereafter, the resist solution is pumped into the valve 77 through the pipe 75.

The workings of the pump 76 will be described hereinafter.

The pump 76 sucks a solution and presses it out alternately.

Figure 10:
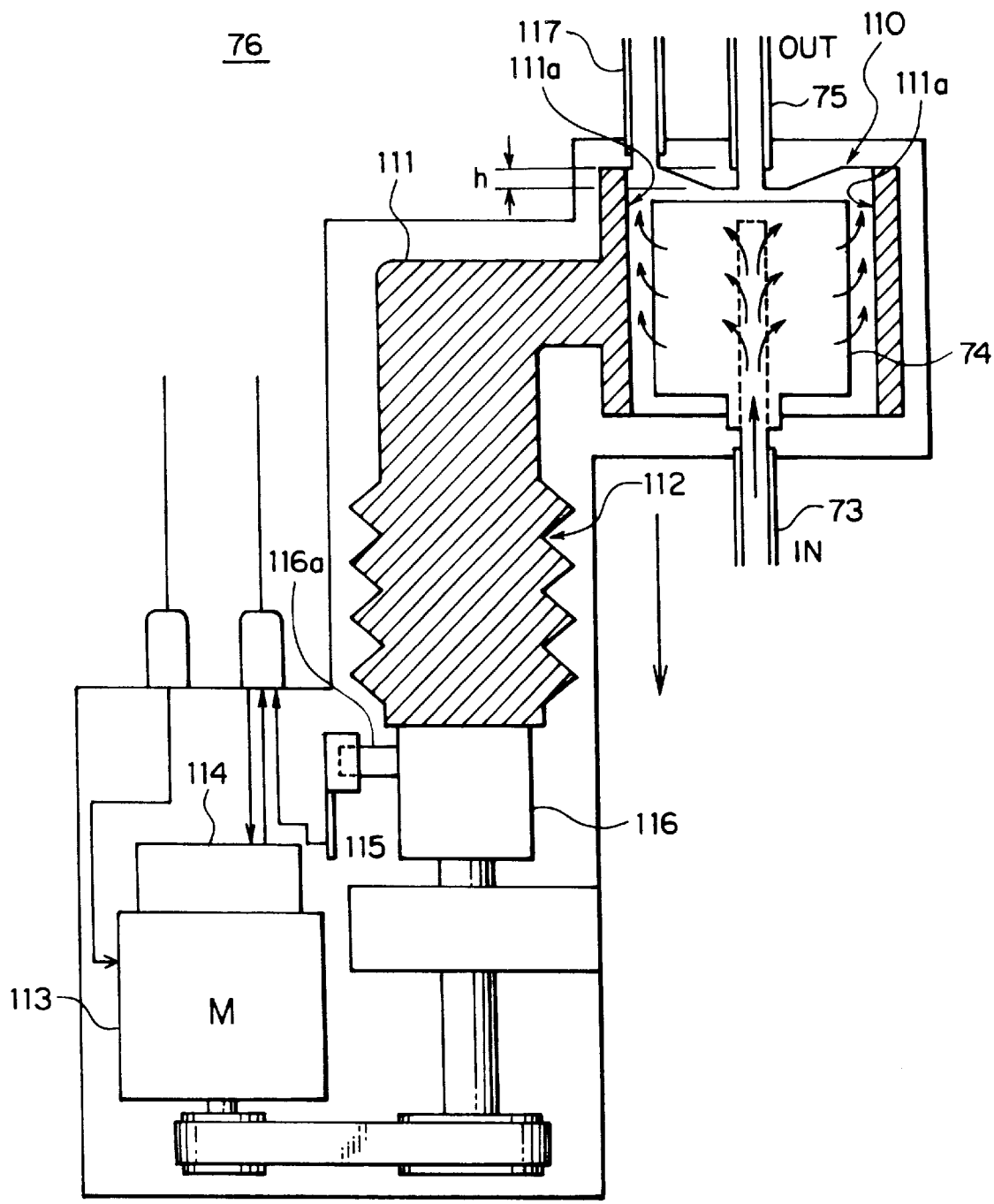
FIG. 10 is a schematic view showing workings of the pump used in the resist coating unit according to an embodiment of the present invention.

FIG. 10 is a schematic view showing the workings of the pump 76 at the time of sucking the solution.

When the solution is sucked, the stepping motor 113 is driven to extend the bellow portion 112 of the tubephragm 111 in an arrow direction. Specifically, the peripheral inwall surface of the pump room 110 is made in a non-expansive (not projecting) state so that pressure within the pump room 110 is reduced below atmospheric pressure. Thus, the resist solution in the resist tank 72 is sucked into the pump room 110 through the suction pipe 73. At this time, in the suction pipe 73, a plenty of through-holes formed on the peripheral surface of a forward end portion thereof open to the inside of the filter 74. Therefore, the resist solution is sucked into the pump room 110 through the inside of the filter 74. The resist solution is filtered in the above process of sucking.

Subsequently, the pump 76 presses the sucked resist solution out.

Figure 11:
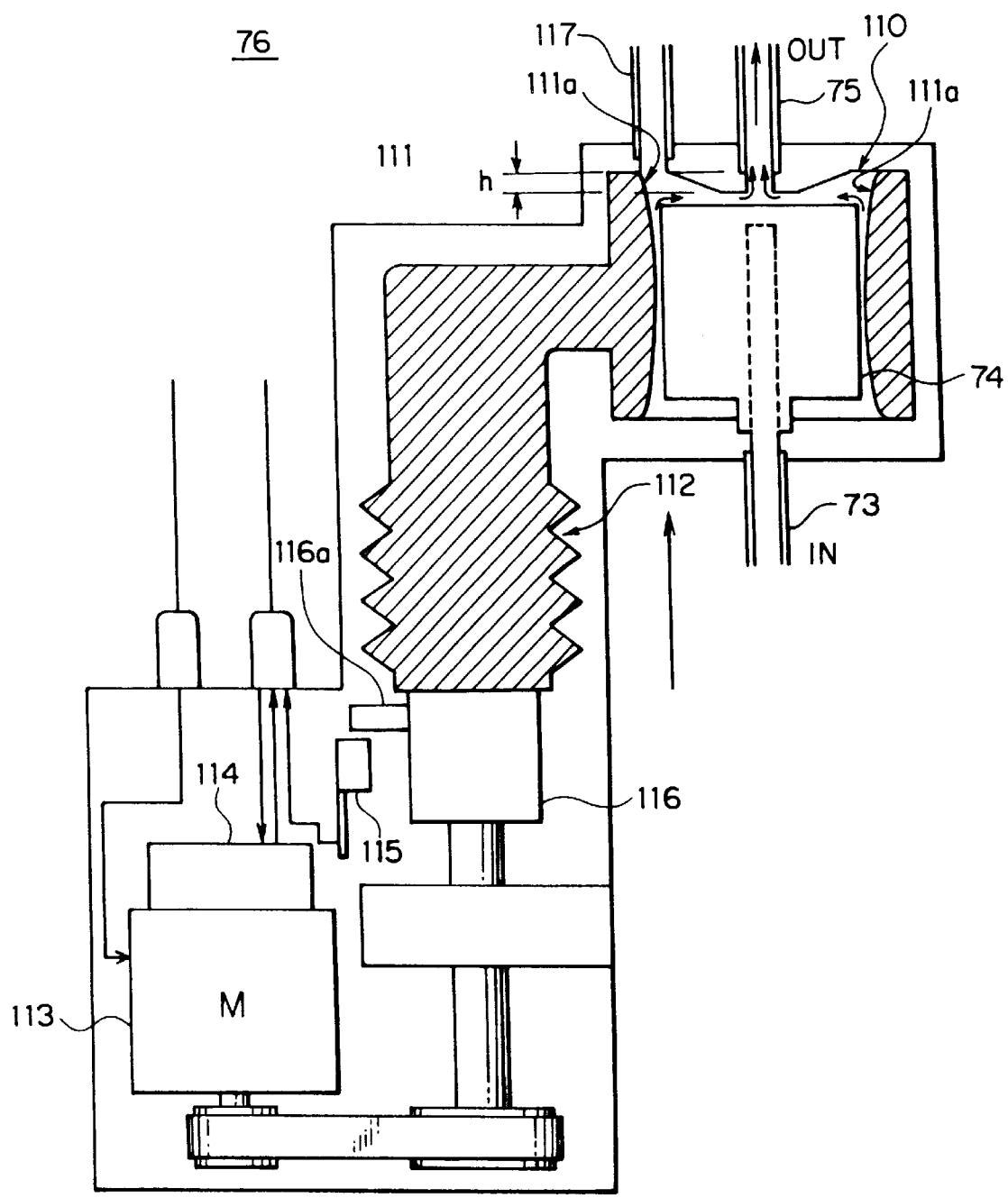
FIG. 11 is a schematic view showing workings of the pump used in the resist coating unit according to an embodiment of the present invention.

FIG. 11 is a schematic view showing workings of the pump at the time of pressing out the resist solution.

The stepping motor 113 is driven so as to press out the resist solution once sucked. Thus, the bellows portion 112 of the tubephragm 111 is compressed. The peripheral inwall surface of the pump room 110 is made in an expansive and projecting state. The pressure in the room 110 is raised by thus reducing the capacity within the pump room 110, and the resist solution which completes filtration in the pump room 110 is discharged from the discharge pipe 75.

This pump 76 conducts the filtration at the time of sucking as described above. In other words, the resist solution can pass through the filter at relatively low speed. Accordingly, it is prevented to make particles or gelling resist once caught pass through the filter by strongly pressing them against the filter, and also the occurrence of bubbles in the resist solution at the time of passing through the filter is prevented.

Next, the mutual workings of the pump 76, the opening and closing valve 79, the suck-back valve 80, and the resist nozzle 60 will be described along each timing chart.

Figure 12:
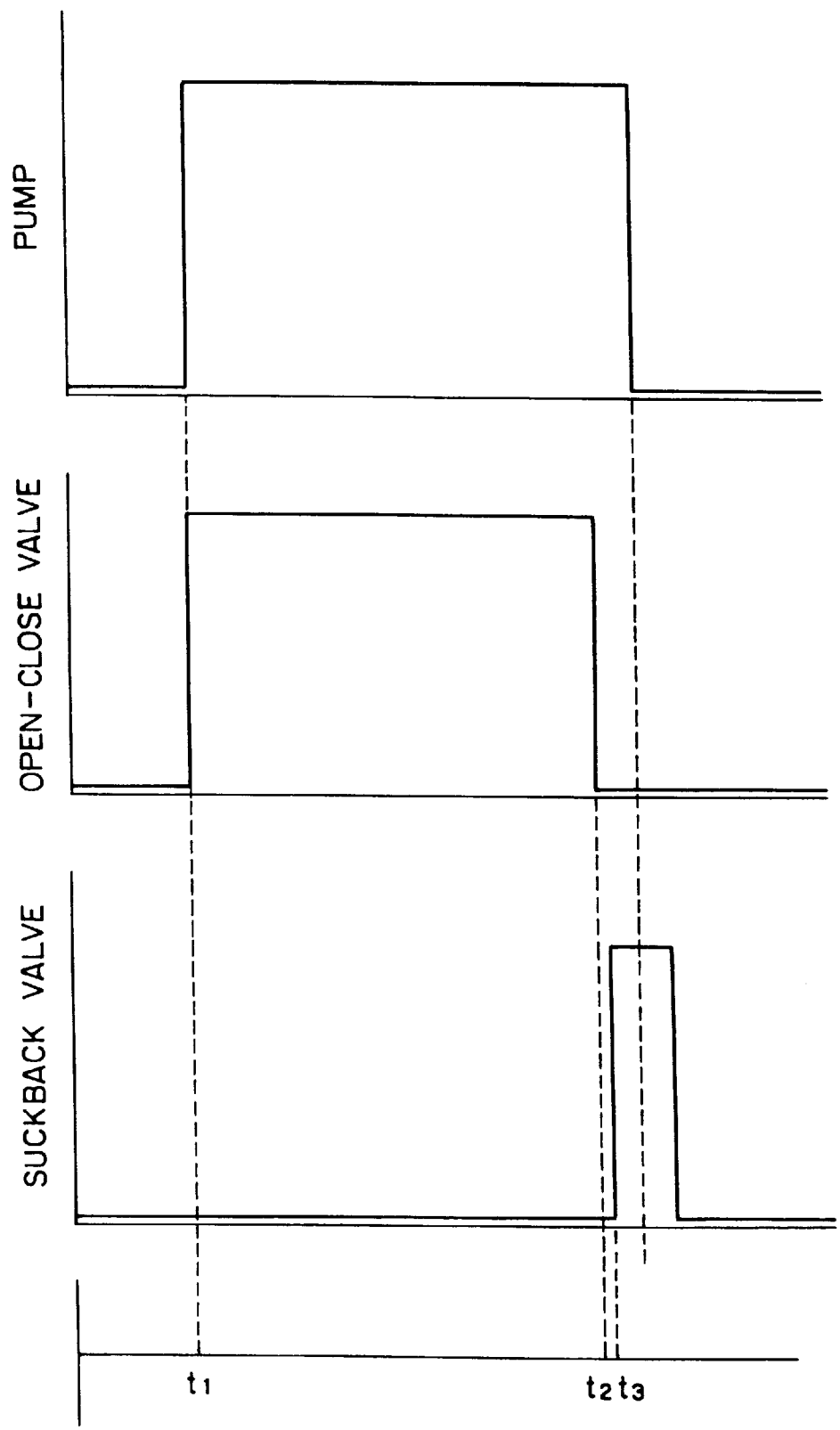
FIG. 12 is a timing c hart of each working of the pump, an opening and closing valve, and a suck-back valve used in the resist coating unit according to an embodiment of the present invention.
Figure 13:
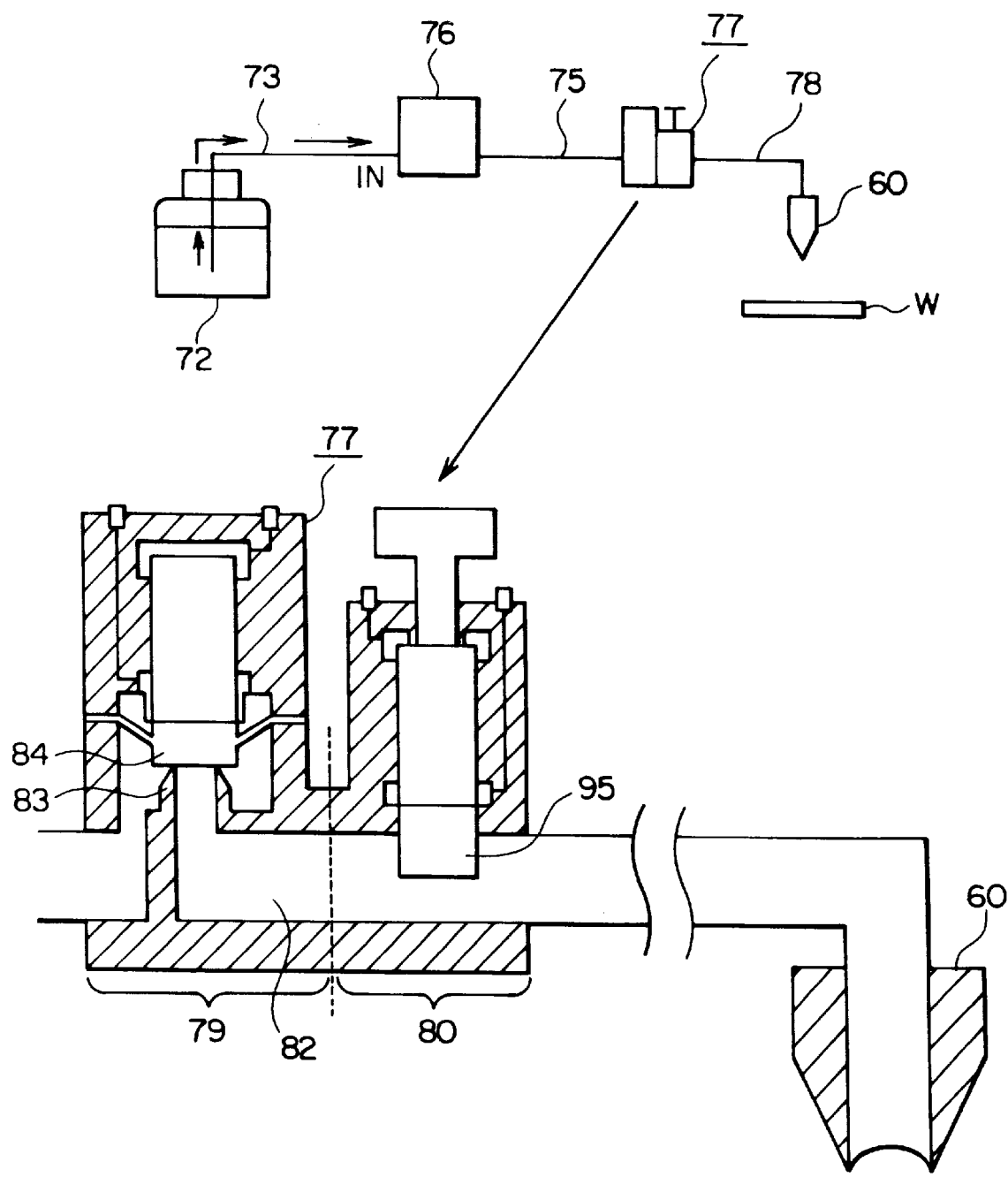
FIG. 13 is a schematic view showing a state before the time of working the opening and closing valve in the resist coating unit according to an embodiment of the present invention.

FIG. 12 is a timing chart of the working of the pump 76 at the time of discharge and each working of the opening and closing valve 79 and the suck-back valve 80. FIG. 13 is a schematic view of each internal state of the opening and closing valve 79, the suck-back valve 80, and the resist nozzle 60 at the time of suction by the pump 76 before discharging a resist solution from the resist nozzle 60.

Before the time t1, as shown in the timing chart of FIG. 12, none of the pump 76, the opening and closing valve 79, and the suck-back valve 80 work.

In other words, as shown in FIG. 13, space between the valve body 84 and the gate portion 83 are closed. The piston 95 is kept in a projecting state to the flow path 82 side. In this state, the solution level of the resist solution at the forward end of the resist nozzle 60 is recessed upward in FIG. 13, that is, in a stable state. Thus, the resist solution does not drip from the forward end of the resist nozzle 60.

Thereafter, at the time t1, the pump 76 starts to press out the resist solution. At the same time, the opening and closing valve 79 is opened to discharge the resist solution from the resist nozzle 60 to the wafer W.

Figure 14:
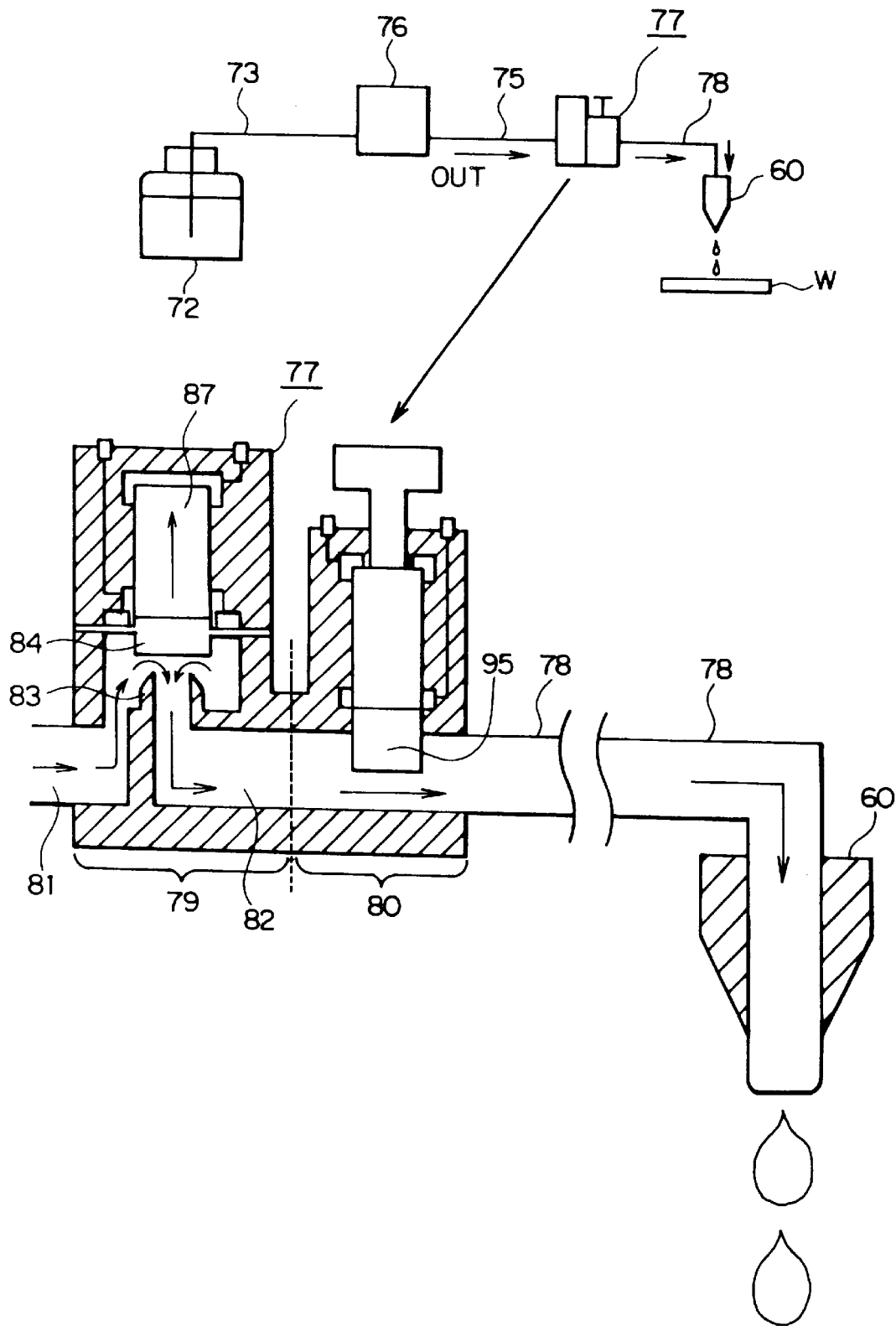
FIG. 14 is a schematic view showing a state at the time of opening the opening and closing valve in the resist coating unit according to an embodiment of the present invention.

FIG. 14 is a schematic view showing the state of discharging the resist solution from the resist nozzle 60 after the opening and closing valve 79 is opened.

At the time t1, the pump 76 starts to work so as to press the resist solution to the opening and closing valve 79. In the opening and closing valve 79 side, synchronously with the start of working of the pump 76, applied voltage to the rod 87 is changed to the low voltage side and the rod 87 contracts. With the contraction of the rod 87, the valve body 84 joined to the base of the rod 87 is raised upward in FIG. 14. As a result, space is formed between the valve body 84 and the gate portion 83 so that the suction side flow path 81 communicates with the discharge side flow path 82. The resist solution is pressed out from the pump 76 to the suction side flow path 81. Accordingly, the resist solution flows into the discharge side flow path 82 through the space between the valve body 84 and the gate portion 83, and drips down to the wafer W by way of the flow path 78 and the resist nozzle 60. During this process, the piston 95 of the suck-back valve 80 is kept in a projecting state to the flow path 82 side.

Subsequently, at the time t2, the opening and closing valve 79 is closed while the pump 76 is working.

Figure 15:
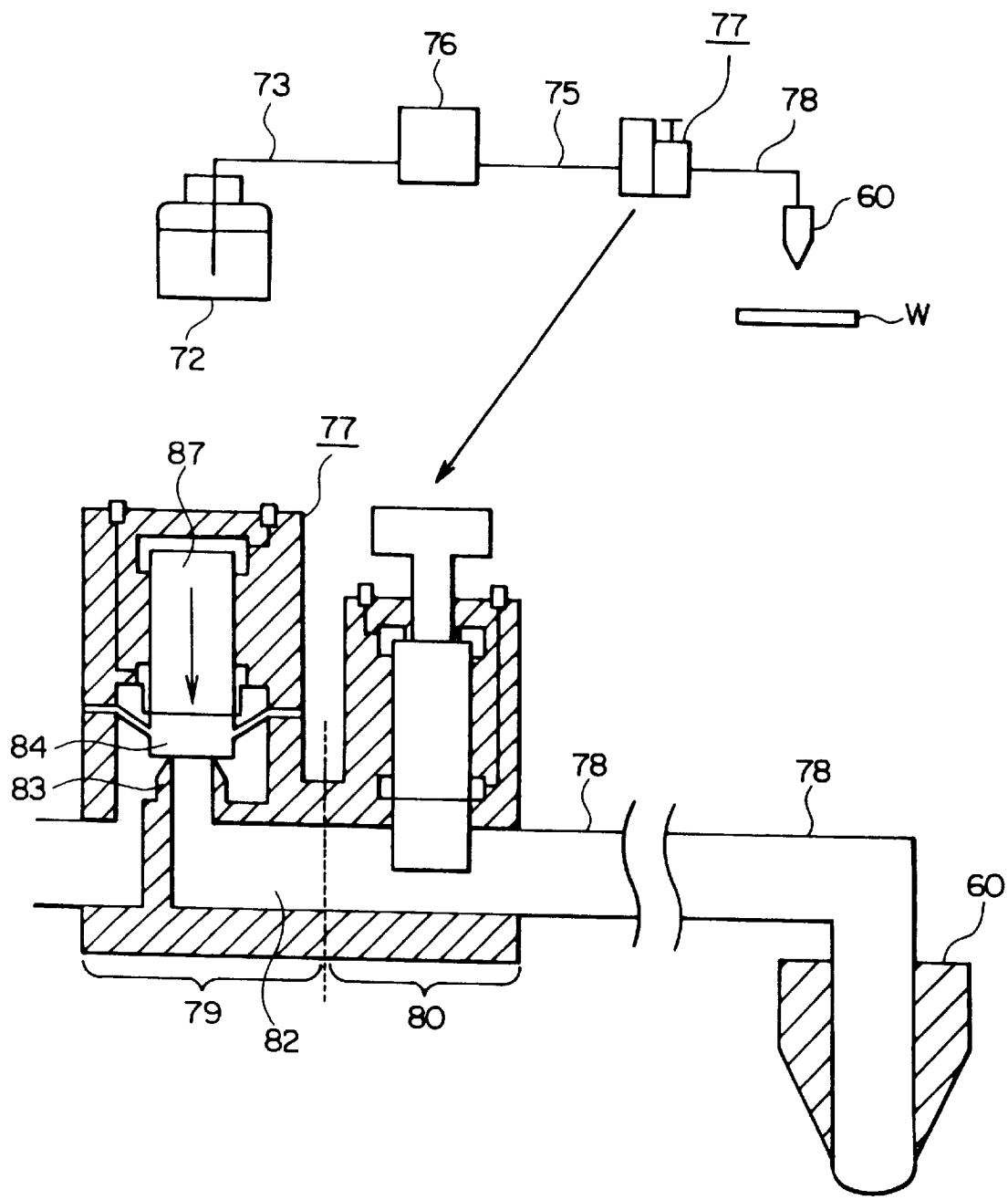
FIG. 15 is a schematic view showing a state immediately after the time of closing the opening and closing valve in the resist coating unit according to an embodiment of the present invention.

FIG. 15 is a schematic view showing an internal state of the valves and the nozzle immediately after the opening and closing valve 79 is closed while the pump 76 is working.

If applied voltage to the rod 87 is changed to a high pressure side after discharging the predetermined amount of resist solution between the time t1 and t2, the rod 87 is immediately extended downward in FIG. 15.

The valve body 84 pressed by the rod 87 abuts on the gate portion 83 so that a flow path between the suction side flow path 81 and the discharge side flow path 82 are closed. At the forward end portion of the resist nozzle 60, the resist solution stops dripping for the time being, but the flow path 78 from the gate portion to the forward end of the resist nozzle 60 is filled with the resist solution. Consequently, as shown in FIG. 15, the solution level of the resist solution at the forward end of the resist nozzle 60 projects in a convex shape downward in Fig, 15 by the weight of the resist solution.

At the t3 after a lapse of a little time from the time t2, the suck-back valve 80 starts to work.

Figure 16:
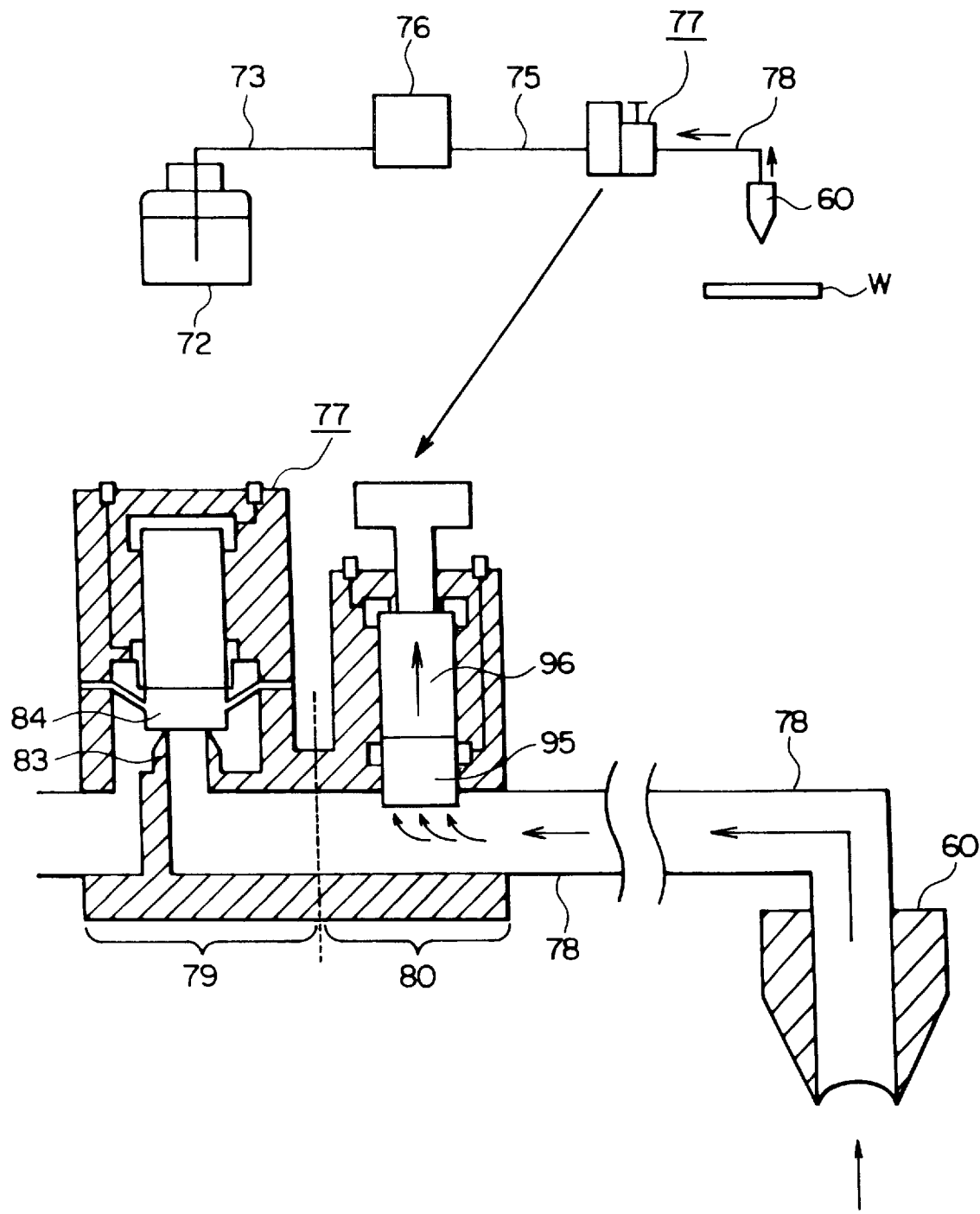
FIG. 16 is a schematic view showing a state at the time of working the suck-back valve in the resist coating unit according to an embodiment of the present invention.

FIG. 16 is a schematic view showing each internal state of the opening and closing valve 79, the suck-back valve 80, and the resist nozzle 60 at the time t3.

At the t3 after a lapse of the designated little time after closing of the opening and closing valve 79, applied voltage to the rod 96 in the suck-back valve 80 side is changed to a low pressure side. Thus, the rod 96 contracts upward in FIG. 16. With the contraction of the rod 96, the piston 95 is pulled into a cylinder 97 which is disposed above in FIG. 16. Thereupon, the capacity in the flow path 78 from the gate portion 83 to the resist nozzle 60 increases, whereby negative pressure acts on the resist solution kept in the flow path 78.

Space between the gate portion 83 and the valve body 84 is closed so that negative pressure acts on the solution level of the forward end of the resist nozzle 60. The negative pressure pulls the solution level into the resist nozzle 60, and the solution level becomes recessed upward in FIG. 16 as shown in FIG. 16.

As described above, the resist coating unit (COT) according to the present embodiment uses a piezovalve which can nearly disregard delay time consumed by the start of working as the opening and closing valve 79. Accordingly, the time of opening and closing the opening and closing valve can be accurately controlled.

In addition, in the resist coating unit (COT) according to the present embodiment uses a piezovalve which can nearly disregard delay time consumed by the start of working as the suck-back valve 80. The time of working the suck-back valve 80 in relation to the time of working the aforementioned opening and closing valve 79 can be accurately controlled.

Consequently, after the opening and closing valve 79 is closed, the suck-back valve 80 starts to work before the resist solution drips down from the forward end of the resist nozzle 60. Accordingly, the resist solution at the forward end of the resist nozzle 60 is sucked back into the resist nozzle 60 so that dripping of the resist solution can be properly prevented.

Moreover, the resist solution is sucked back into the resist nozzle 60 when remaining in the forward end portion of the resist nozzle 60, thereby preventing the occurrence of bubbles by too much suck-back of the solution.

Furthermore, as described above, the use of the tubephragm-type bellows pump 76 with a built-in filter prevents the occurrence of bubbles. Thus, together with effects of the opening and closing valve 79, the suck-back valve 80, and the above pump 76, the occurrence of bubbles is more securely prevented, which results in effects that poor film thickness is hard to cause and hence a yield rate is improved.

It should be mentioned that the present embodiment does not limit the scope of the present invention.

Piezoelectric elements, for example, are used as a driving source for an opening and closing valve or a suck-back valve in the aforementioned embodiment, but anything is available if it is a driving source which electrically works and can almost disregard delay time. For example, drive by a servomotor or the use of a voice coil actuator with a moving coil as a driving source is also possible.

In the aforementioned embodiment, the present invention is applied to a resist coating unit. The present invention is, however, applicable to coating units for coating a wafer with other treatment solutions such as a unit for forming an antireflection film on a wafer by coating.

In addition, the present invention can be applied to a unit for coating a resist solution or other treatment solutions on substrates other than a semiconductor wafer, for example, a LCD substrate.

Figure 17:
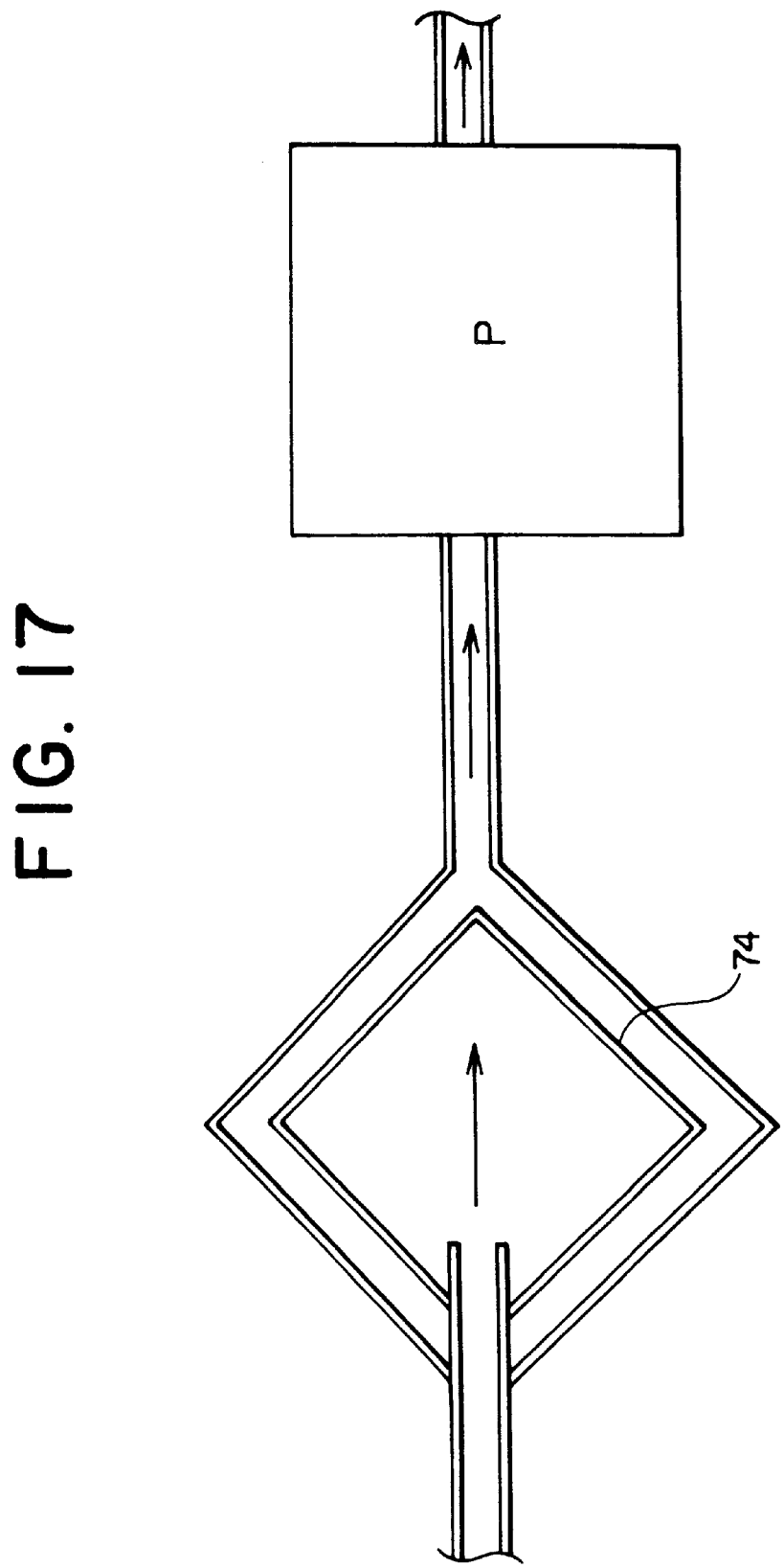
FIG. 17 is a schematic view showing an attaching state of a filter according to another embodiment of the present invention.

Besides, in the aforementioned example, a built-in filter attached to a suction side within a bellows pump is used as a filter, but if filters are attached between a tank and a pump, that is, to the treatment solution sucking side of the pump, they are available. Accordingly, as shown in FIG. 17, a filter may be disposed outside a pump.

In addition, in the aforementioned example, a coating unit is provided with one nozzle, one opening and closing valve, and one suck-back valve, but a coating unit may be provided with two or more nozzles, two or more opening and closing valves, and two or more suck-back valves.

Accordingly, it is possible that plural nozzles and plural pumps are connected and an opening and closing valve or a suck-back valve is disposed respectively between each of the nozzles and each of pumps. In this case, a coating unit is what is called multinozzle-type coating unit which can discharge a coating solution from each of plural nozzles at individual and independent timing. In this case, it is preferable that piezoelectric element-type valve body is used as a valve body for an opening and closing valve or a suck-back valve.

What is claimed is:

1. A coating unit comprising:

a tank keeping a coating solution;

a nozzle discharging the coating solution supplied from said tank toward a treatment body;

a pump, disposed between said tank and said nozzle, pressing out the coating solution in said tank;

an opening and closing valve, disposed between said pump and said nozzle, opening and closing a flow path of the coating solution by being driven electrically; and a suck-back valve, disposed between said opening and closing valve and said nozzle, applying negative pressure to the coating solution in the flow path by being driven electrically after a lapse of designated time after said opening and closing valve is closed.

2. The coating unit according to claim 1, wherein said opening and closing valve and/or said suck-back valve are driven by piezoelectric elements.

3. A coating unit comprising:

a tank keeping a coating solution;

a nozzle discharging the coating solution supplied from said tank toward a treatment body;

a pump disposed between said tank and said nozzle;

a filter disposed between said tank and said pump; and an opening and closing valve, disposed between said pump and said nozzle, opening and closing a flow path of the coating solution by being driven electrically.

4. The coating unit according to claim 3, wherein said filter is built in a coating solution inflow side of said pump.

5. The coating unit according to claim 3, wherein said opening and closing valve is driven by piezoelectric elements.

6. The coating unit according to claim 5, wherein said filter is built in a coating solution inflow side of said pump.

7. A coating unit comprising:

a tank keeping a coating solution;

a nozzle discharging the coating solution supplied from said tank toward a treatment body;

a pump disposed between said tank and said nozzle;

a filter disposed between said tank and said pump;

an opening and closing valve, disposed between said pump and said nozzle, opening and closing a flow path of the coating solution by being driven electrically; and a suck-back valve, disposed between said opening and closing valve and said nozzle, applying negative pressure to the coating solution in the flow path by being driven electrically after a lapse of designated time after said opening and closing valve is closed.

8. The coating unit according to claim 7, wherein said opening and closing valve and/or said suck-back valve are driven by piezoelectric elements.

9. The coating unit according to claim 7, wherein said filter is built in a coating solution inflow side of said pump.

10. The coating unit according to claim 8, wherein said filter is built in a coating solution inflow side of said pump.

11. A coating unit comprising:

a tank keeping a coating solution;

two or more nozzles discharging the coating solution supplied from said tank toward a treatment body;

a pump disposed between said tank and each of said nozzles;

a filter disposed between said tank and said pump;

two or more opening and closing valves, disposed between said pump and each of said nozzles, opening and closing a flow path of the coating solution by being driven electrically; and two or more suck-back valves, disposed between each of said opening and closing valves and each of said nozzles, applying negative pressure to the coating solution in the flow path by being driven electrically after a lapse of designated time after said opening and closing valve are closed.

12. The coating unit according to claim 11, wherein said opening and closing valves and/or said suck-back valves are driven by piezoelectric elements.

13. The coating unit according to claim 11, wherein said filter is built in a coating solution inflow side of said pump.

14. The coating unit according to claim 12, wherein said filter is built in a coating solution inflow side of said pump.

\* \* \* \* \*